(12) United States Patent
Xie et al.

(10) Patent No.: US 7,095,343 B2
(45) Date of Patent: Aug. 22, 2006

(54) CODE COMPRESSION ALGORITHMS AND ARCHITECTURES FOR EMBEDDED SYSTEMS

(75) Inventors: Yuan Xie, Wiliston, VT (US); Wayne H Wolf, Princeton, NJ (US)

(73) Assignee: Trustees of Princeton University, Princeton, NJ (US)

( * ) Notice: Subject to any disclaimer, the term of this patent is extended or adjusted under 35 U.S.C. 154(b) by 142 days.

(21) Appl. No.: 10/267,166

(22) Filed: Oct. 9, 2002

(65) Prior Publication Data

US 2003/0128140 A1     Jul. 10, 2003

Related U.S. Application Data

(60) Provisional application No. 60/327,867, filed on Oct. 9, 2001, provisional application No. 60/358,004, filed on Feb. 15, 2002.

(51) Int. Cl.
    *H03M 7/00*      (2006.01)
(52) U.S. Cl. ........................... 341/107; 341/106
(58) Field of Classification Search ........... 341/50–107
See application file for complete search history.

(56) References Cited

U.S. PATENT DOCUMENTS

| | | | | |
|---|---|---|---|---|
| 5,023,611 A | * | 6/1991 | Chamzas et al. | 341/51 |
| 5,216,423 A | * | 6/1993 | Mukherjee | 341/79 |
| 5,220,325 A | * | 6/1993 | Ackland et al. | 341/67 |
| 5,298,896 A | * | 3/1994 | Lei et al. | 341/51 |
| 5,471,206 A | * | 11/1995 | Allen et al. | 341/51 |
| 5,475,388 A | * | 12/1995 | Gormish et al. | 341/107 |
| 5,583,500 A | * | 12/1996 | Allen et al. | 341/107 |
| 5,623,262 A | * | 4/1997 | Normile et al. | 341/67 |
| 5,825,314 A | * | 10/1998 | Kawauchi et al. | 341/67 |
| 5,949,356 A | * | 9/1999 | Kim et al. | 341/67 |
| 6,081,213 A | * | 6/2000 | Hosaka | 341/107 |
| 6,256,608 B1 | * | 7/2001 | Malvar | 704/230 |
| 6,310,563 B1 | * | 10/2001 | Har et al. | 341/50 |
| 6,456,209 B1 | * | 9/2002 | Savari | 341/67 |
| 6,633,608 B1 | * | 10/2003 | Miller | 375/240.02 |
| 2003/0212879 A1 | * | 11/2003 | Henkel et al. | 712/208 |

\* cited by examiner

*Primary Examiner*—Linh Van Nguyen
(74) *Attorney, Agent, or Firm*—Woodcock Washburn LLP

(57) ABSTRACT

Code compression techniques and decompression architectures for embedded systems are disclosed, providing good compression ratio while improving decompression time for VLIW instructions and reducing bus power consumption. The invention includes two fixed-to-variable (F2V) length code compression schemes based on a reduced arithmetic code compression algorithm combining arithmetic coding with probability models; a static probability model using static coding and semi-adaptive coding using a Markov model. Multi-bit decompression methods for the F2V techniques are presented, together with a parallel decompression scheme that tags and divides a compressed block into smaller sub-blocks. The Markov model provides better compression ratio, but the static model has a less complicated decompression unit design. The invention also includes two variable-to-fixed (V2F) length coding algorithms, one based on Tunstall coding and another on arithmetic coding. The V2F algorithms are also combined with a static model and a Markov model.

48 Claims, 15 Drawing Sheets

| bits | codeword |
|------|----------|
| 000000 | 00000 |
| 010001111 | 00001 |
| 100011 | 00010 |
| 001000 | 00101 |
| 00001 | 01011 |
| 0100011 | 01100 |
| 00100101 | 01101 |
| ... | ...... |

000000 00001 001000 100011 010001111

⬇ code compression 00000 01011 00101 00010 00001

CODE COMPRESSION ALGORITHMS AND ARCHITECTURES FOR EMBEDDED SYSTEMS

RELATED APPLICATIONS

This application claims benefit of U.S. Provisional Application Ser. No. 60/327,867, filed Oct. 9, 2001, entitled "Code Decompression Architecture for VLIW Processors." This application also claims benefit of U.S. Provisional Application Ser. No. 60/358,004, filed Feb. 15, 2002, entitled "Code Compression for VLIW Processors Using Variable-to-fixed Coding."

FIELD OF THE INVENTION

The present invention relates generally to code compression and decompression, and more particularly to methods and architectures of flexible instruction code compression and decompression using fixed-to-variable and variable-to-fixed length coding.

BACKGROUND OF THE INVENTION

Embedded computing systems are space and cost sensitive. Memory is one of the most restricted resources, posing serious constraints on program size. For example, in a high-end hard disk drive application, an embedded processor occupies a silicon area of about 6 mm$^2$, while the program memory for that processor takes 20 to 40 mm$^2$. Reducing program size, therefore, could result in significant savings in terms of cost, size, weight, and power consumption. In VLIW architectures where a high-bandwidth instruction pro-fetch mechanism is required to supply multiple operations per cycle, reducing code size and providing fast decompression speed are critical to overcoming the communication bottleneck between memory and CPU.

Data compression is a mature field. However, most of the existing state-of-art data compression algorithms cannot be applied to code compression directly. Compressed code must be decompressed during program execution, implying that random access in decompression is necessary since code has branch, jump and call instructions altering flow of the program.

Existing statistical code compression algorithms are mostly variable-to-variable coding or fixed-to-variable coding, meaning the decompression procedure is sequential, since the decompressor does not know where to start decompressing the next symbol until the current symbol is fully decompressed. Because VLIW machines have long instruction words, existing code compression algorithms, which are very difficult to parallelize, introduce very long delays into instruction execution during decompression.

VLIW architectures are attractive due to hardware simplicity and compiler technique advances. VLIW architectures have been widely adopted in a number of high-performance microprocessors in different application areas, from DSP (Texas Instrument's TMS320C6x family and Lucent Technology's StarCore) and VSP (e.g., Philips Semiconductor's TriMedia), to general-purpose microprocessors such as Intel's Itanium, which adopts the IA-64 architecture. Even though VLIW processors have gained a lot of popularity recently, code compression techniques targeting VLIW architectures have not been studied as extensively as in RISC architectures.

Traditional VLIW architectures need more program memory because they require rigid instruction format and/or special pack/unpack operations. To address the program memory issue, modern VLIW processors have flexible instruction formats. Unfortunately, dictionary code compression techniques proposed to date work for rigid instruction formats only. Further, flexible instruction formats mean each sub-instruction within the long instruction word must not necessarily correspond to a specific functional unit. This eliminates most NOP instructions found in code for rigid VLIW architectures, making the code denser. Some VLIW-based architectures introduced in the last three years, such as StarCore's SC 140, use mixed-width instruction sets (supporting both 16-bit and 32-bit instructions). In this case, the processor uses short instructions when the full range of instruction options is not necessary, and reserves use of the longer instructions for performance-critical software sections requiring the full power of the architecture. These efforts result in VLIW code that is less compressible.

Code density is not the only design goal for embedded systems, power is also a concern. Bus power consumption is a major part of the total system power consumption. Instruction bus power optimization has not, however, been intensively explored, since the instruction bus is normally considered rigid and unchangeable.

For the foregoing reasons, there is a need in the art for code compression techniques to ease the memory constraint problem in embedded systems while minimizing bus power consumption, techniques applicable to the flexible instruction formats of VLIW processors and operational with a fast decompression scheme providing random access during decompression with minimal delay to instruction execution.

SUMMARY OF THE INVENTION

The present invention presents code compression techniques and decompression architectures for embedded systems, providing good compression ratio while improving decompression time for VLIW instructions. The compression/decompression schemes are transparent to the processor, requiring no change to compilers, linkers, and loaders. In addition to balancing compression ratio with decompression overhead, the present invention provides bus encoding techniques to reduce bus power consumption. Although the present invention is applicable to the flexible instruction formats of VLIW processors, and much of the disclosure is directed to VLIW embedded architectures, the techniques are general and suitable for RISC architectures as well.

The present invention includes two fixed-to-variable (F2V) length code compression schemes based on a reduced arithmetic code compression algorithm combining arithmetic coding with probability models, a static probability model using static coding and semi-adaptive coding using a Markov model. Multi-bit decompression methods for the F2V techniques are presented, together with a parallel decompression scheme that tags and divides a compressed block into smaller sub-blocks. While the Markov model may provide better compression ratio than the static model, the decompression unit design is more complicated and much larger than the static model. The decompression architecture for the static model is not application specific, therefore requiring no modification when applications running on the system change.

Two variable-to-fixed (V2F) length coding algorithms are also provided, one based on Tunstall coding and another based on arithmetic coding. The V2F algorithms are combined with two probability models. Using a static model, parallel decompression can be achieved, because the codeword length is fixed, and code compression is not application specific. Using a Markov model, better compression ratio is achieved with application specific code compression and bus power consumption reduction through bus encoding combined with the compression. Decompression procedure is sequential with the Markov model, however, decompression design is simpler with the static model, and the decompression unit is smaller and faster.

In one aspect of the present invention, a method of code compression generates a static probability model for a program, splits codes into blocks, and compresses instructions block by block to create fixed to variable code, the block by block compression providing random block access in decompression during program execution. The static probability model might assume ones and zeros in the code have independent and identical distribution (iid), where a fixed probability for bit 1 and bit 0 is allocated irrespective of position of the respective bit within instructions. Or, the static probability model might assume that ones and zeros in the code have a probability related to a position within a byte or instruction.

When splitting codes into blocks, an instruction fetch pocket could be selected as a block size. Each instruction fetch pocket size block could be split into sub-blocks, the sub-blocks then compressed in parallel while compression of the blocks is sequential. Further, one or more tags could be attached to a front of each block, the tag indicating a size of each compressed sub-block so the decompressor would be capable of determining a location of each compressed block, so decompression of each compressed sub-block occurs simultaneously.

Generating the static probability model, in this aspect of the invention could include gathering one or more sample programs for a specific instruction set architecture, calculating probabilities for each program, and determining the average of the probabilities calculated for each program to generate the static probability model. The static probability model, once generated, could be fixed for a specific instruction set architecture and remain unchanged.

In another aspect of the present invention, a method of code decompression includes constructing a decoder tree, designing a multiple bit decoder table based on the decoder tree, and performing multiple bit decompression. Designing the multiple bit decoder table could require that compressed binary streams are decodable and distinguishable. The decoder table could be simplified, if possible, by removing states and transitions never reached.

The decoder tree could be constructed by following all paths starting from state 0, or the decoder tree could be constructed by combining a Markov probability model with a finite state machine decoder table.

Each entry in the decoder table could have one or more matches, the matches used to match encoded bits to produce corresponding decoded bits, and multiple bits are decoded per cycle. The decoder table could be designed during an encoding phase and be application specific, where each application has a distinctive Markov probability model.

Multiple bit decompression could include comparing encoded bits with corresponding matches in the decoder table and selecting output from the decoder table. Each match in the decoder table could indicate which, and how many, individual bits of the encoded bits to compare. Output could include decoded bits and a next entry address. A comparator could control a multiplexor to select the output, where the output includes decoded bits and a next entry address and the multiplexor sends the next entry address to the decoder table.

In another aspect of the present invention, a decompression processor includes an input buffer to accept input from an instruction memory, match logic including one or more comparators and multiplexors, where the match logic receiving input from the input buffer and a decoder table, and an output buffer to accept uncompressed instruction from the input buffer or from the match logic. The one or more multiplexors can select matches from the one or more comparators and send uncompressed instruction to the output buffer. The one or more multiplexors can also instruct the input buffer how many bits have been matched and are in need of shifting out, while also sending next entry addresses to the decoder table.

In another aspect of the present invention, a N-way parallel decompression processor includes N-match logics, each including one or more comparators and multiplexors and one decoder table serving each of the N-match logics, where the processor is capable of decompressing N-sub-blocks simultaneously. The decoder table can be designed during an encoding phase and be application specific, where each application has a distinctive Markov probability model. The decoder table could also not be application specific, so that the decoder table does not require change when an application running on the system changes.

In another aspect of the present invention, a method of code compression includes generating a variable to fixed length codebook and compressing instructions block by block to provide random block access in decompression during program execution. Generating the variable to fixed length codebook could implement Tunstall coding, could implement a Markov probability model, could assume a binary stream has independent and identical distribution, could involve construction of a coding tree, and/or could involve arbitrarily assigning a codeword for each bit sequence. Codebook generation could also implement arithmetic coding, and could involve integer interval division rather than real interval division.

Compressing instructions block by block could begin at a root node and include traversing to a first branch or to a second branch depending on whether a "0" or a "1" is encountered in a respective bit sequence, assigning a codeword upon encountering a leaf node, the codeword being predetermined and related to the respective leaf node, and returning to the root node and repeating this process for each bit sequence. Each compressed block might then be byte aligned, and/or extra bits could be padded to the block if tree traversal ends at a non-leaf node, where the traversal is continued until a leaf node is encountered.

Implementing a Markov probability model, for this aspect of the invention, could include gathering statistics, where a width and depth of the Markov model is determined and a probability of each transition is determined, and generating an N-bit variable to fixed length coding tree and codebook for each state in the Markov model, where N equals the number of bits in the codeword. Each state in the Markov model could have its own coding tree and codebook, and compressing instructions for each block could begin by using the coding tree and codebook for initial state and include traversing the coding tree according to input bits until a leaf node is encountered, producing a codeword, where the codeword is related to the leaf node encountered and the leaf node is associated with a Markov state, proceeding to a root node of the coding tree of the state indicated by the leaf node encountered, and repeating this process until exhausting the input bits of the respective block.

In another aspect of the present invention, a method to decompress compressed code includes segmenting compressed code into chunks, so that a compression codeword of N-bits results in one or more N-bit chunks, and each chunk is decompressed simultaneously, perhaps in one clock cycle. One decoder could be associated with each chunk and include one N-bit table lookup unit, all the decoders could refer to one codebook for simultaneous decompression.

In another aspect of the present invention, a method for reducing bus power consumption when transmitting compressed instructions includes constructing a codeword transition graph, producing a formula from the codeword transition graph to determine total bus toggles required for transmission of the compressed instructions, and then determining codeword assignments to minimize the total bus toggles. Constructing the codeword transition graph could rely on profiling information about adjacency of instruction pairs. The codeword transition graph could include nodes, edges, and a weight characterization associated with each edge. Each node in the graph could be a codeword in a codebook, each edge could connect two nodes, indicating that bus toggles exist between the two respective codewords, and/or the weight specifies a number of bus toggles existing between the two respective codewords.

Determining codeword assignments to minimize the total bus toggles could include application of an algorithm, where all edges are sorted by their respective weight in decreasing order, and valid codewords are assigned with minimal Hamming distance to respective pairs of nodes associated with each edge sorted, in the order sorted. If weight is $E_i$, Hamming distance is $H_i$, codewords are assigned to minimize a sum of calculations $H_i*E_i$ each edge. The sum of calculations $H_i*E_i$ for each represents the total bus toggles.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

DETAILED DESCRIPTION OF THE INVENTION

Figure 1:
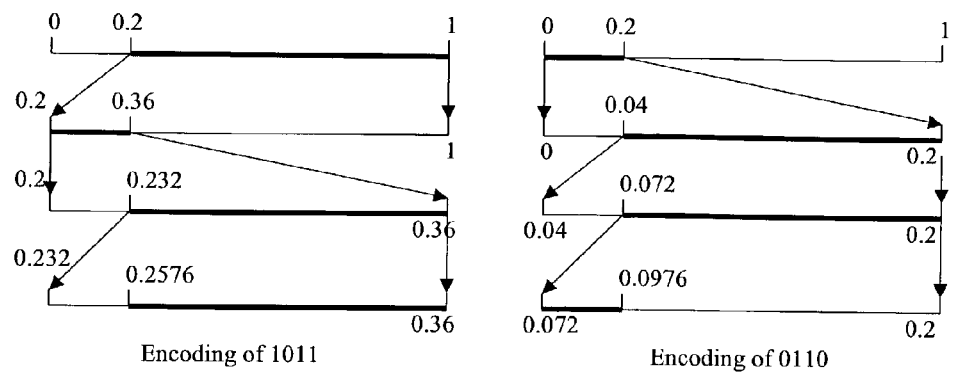
FIG. 1 illustrates arithmetic coding by compressing a binary stream.

Previous work using dictionary-based methods of code compression assume that VLIW (Very Long Instruction Word) instructions have restricted format, where instruction positions within a long instruction word correspond to specific functional units. Modern VLIW architectures use flexible instruction formats, thereby requiring code compression approaches other than dictionary-based compression algorithms.

The code compression schemes of the present invention are capable of compressing flexible instruction formats, where any functional unit can be used for any position in the instruction word. Methods are demonstrated using TMS320C6x and IA-64 architectures.

1.0 Fixed-To-Variable Code Compression (F2VCC)

This section describes code compression schemes using fixed-to-variable length coding based on a reduced precision arithmetic coding algorithm. Decompression architecture design is presented, allowing for parallel and multi-bit decompression, with implementation in TSMC 0.25 technology and strategic tradeoffs between compression ratio and decompression overhead.

1.1 Binary Arithmetic Coding

Huffman coding is a popular statistical compression algorithm that generates variable-length codes. Huffman coding starts from calculating the frequency (or probability) of each symbol's appearance in the source input. The individual symbols are leaf nodes that are connected to build a binary tree. The following presents the procedure for building a binary tree:

1. Starting from a list of leaf nodes, the two nodes with the lowest probability are located.
2. A parent node for these two nodes is created. It is assigned a probability equal to the sum of the two child nodes. Child nodes are removed from the list and the parent node is added to the list.

3. The previous step is repeated until only one node is left in the list. This node is the root node of the Huffman tree.
4. Each leaf node is assigned a codeword by traversing the tree from the root to the leaf node, recording 0 for a left branch and 1 for a right branch.

Huffman coding gives high-probability symbols shorter codewords and less probable ones longer codewords. Huffman coding produces optimal codes for a given probability distribution, thereby achieving compression performance close to the entropy. Huffman coding, however, does not achieve good code compression when probability is highly skewed (i.e., the probability of a symbol is close to 1), in which case the entropy is small and good compression is expected.

Arithmetic coding is a statistical compression algorithm generating variable-length codes. Compared to Huffman coding, arithmetic coding achieves better compression gains with small alphabets (such as binary coding), and when probabilities are highly skewed (i.e., when the probability of a symbol is close to 1).

Arithmetic coding has advantages and disadvantages. The most distinctive advantage is separation of coding and modelling. Arithmetic coding can be used with any probability model that can provide the probability distribution of the source. Arithmetic coding provides great flexibility since the arithmetic coder doesn't require change when the probability model is changed. Another advantage is optimality, arithmetic coding can approach arbitrarily close to entropy. In theory, arithmetic coding is optimal because minimum average code lengths are achieved. One disadvantage, however, is that arithmetic coding involves floating point calculations and multiplications, as shown in the following example, which compresses a binary stream. For more information on arithmetic coding, the following is incorporated by reference for its useful background information: T. C. Bell, J. G. Cleary, and I. H. Witten, *Text Compression*, Prentice Hall, N. J., 1990.

Referring to FIG. 1, an input binary stream is represented by an interval between 0 and 1 on the real number line. Each input bit narrows this interval. Given an input binary stream of 1011, and assuming that the probability of a bit being 1 is 0.8, and the probability of a bit being 0 is 0.2, interval division occurs as follows. The interval is divided in proportion to the probability. If the input bit is 0, the lower portion of the partition remains; if the input bit is 1, the upper portion of the partition remains. Starting from the initial interval [0,1), since the first bit is 1 and Prob(1)=0.8, the interval kept is [0.2,1). The remaining interval is divided [0.2,1) to [0.2,0.36) and [0.36,1) in proportion to Prob(0) =0.2 and Prob(1)=0.8. Since the second bit is 0, the interval [0.2, 0.36) is selected and the other partition is discarded. Continuing in this manner, the next remaining interval is [0.232,0.36) and the final interval is [0.2576, 0.36). Accordingly, 0110 is represented by interval [0.072,0.0976). The interval remaining uniquely represents a particular input binary sequence, since it is disjoint from all other intervals generated by any different input binary sequence. Any number inside this interval can be selected to represent the input binary sequence.

The decoding procedure is straightforward. Given the final interval [0.2576,0.36) (or any number inside the interval), the decoder can immediately deduce that the first bit is 1, since the interval (or the number) is within the interval of [0.2,1), which is allocated to 1 for the first input bit. It is also clear that, after the first bit is determined to be 1, the second bit is 0, since the first bit produced interval [0.2,0.8) and the final interval (or any number inside the interval) is within [0.2,0.36), which is allocated to 0 for the second input bit. Proceeding like this, the whole binary stream can be retrieved given the final interval (or any number inside the interval) and the probabilities.

To summarize, the procedure to encode a binary stream using arithmetic coding is described as follows:
1. Start with an interval [L,H), which is initialized to [0,1);
2. For each input bit:
   (a) The current interval is divided into two sub-intervals, one for input 0 and the other for input 1. The size of the sub-interval is proportional to the probability that the next bit is 0 or 1;
   (b) The subinterval corresponding to the bit that actually occurs next is selected, and is made the current interval; and
3. Output enough bits to distinguish the final current interval from all other possible intervals.

Arithmetic coding, as described above, has two major shortcomings: 1) the current interval shrinks during encoding procedure, which requires high precision arithmetic; and 2) there is no output produced until the entire stream is read.

To avoid shrinking intervals during interval subdivision, an interval expansion technique can be adopted. For background information on the interval expansion technique, refer again to T. C. Bell, J. G. Cleary, and I. H. Witten, *Text Compression*, Prentice Hall, N. J., 1990, which is incorporated by reference. Starting from interval [L,H), a midpoint is defined as M (M=L+(H-L)/2), a first quarter point as Q (Q=L+(H-L)/4), and a third quarter point as Q'(Q'=L+3·(H-L)/4). The following recursive loop is used to expand the subinterval [a,b), which is contained in [L,H):

The loop is repeatedly executed until the interval [a,b) does not sit entirely within [L,M), [Q,Q') or [M,H).
1. If the interval [a,b) sits entirely within [L,M), the lower half of [L,H) (i.e., b≦M), multiply both endpoints by two: [a,b)=>[2·a, 2·b). Output a 0. Continue until the loop is ended.
2. If the interval [a,b) sits entirely within [M,H), the upper half of [L,H) (i.e., if a≧M), subtract M from both a and b and then multiply both endpoints by two: [a,b)=>[2·(a-M), 2·(b-M)). Output a 1. Continue until the loop is ended.
3. If the interval [a,b) sits entirely within [Q,Q'), the second and third quarter of [L,H) (i.e., if a≧Q and b≦Q'), then subtract Q from both a and b and then multiply both endpoints by two: [a, b)=>[2·(a-Q), 2~(b-Q)). In this case, it is not yet known whether a 0 or a 1 should be output, but whatever should be output, the next bit must be the opposite. The encoder keeps track of this and records the output bit to be "f". When the next output bit is 0, "f" will be replaced by a "1", and vice versa (this is called "bits to follow technique", where background information can again be found in T. C. Bell, J. G. Cleary, and I. H. Witten, *Text Compression*, Prentice Hall, N. J., 1990, which is incorporated by reference. Continue until the loop is ended.

This arithmetic coding implementation essentially avoids the shrinking interval problem and outputs bits as soon as possible. The original arithmetic coding suffers from slow execution due to the floating point calculations required for interval division during encoding and decoding. This problem is solved by approximating the standard procedure and avoiding floating point calculations. The approximation follows a lookup-table generation technique using reduced precision arithmetic coding. For background information on the lookup-table generation technique, see the following, which is incorporated by reference: P. G. Howard and J. S. Vitter, Parallel Lossless Image Compression Using Huffman and Arithmetic Coding, *Information Processing Letters*, Vol. 59:65–73, 1996.

Based on the interval expansion technique, reduced-precision arithmetic coding can be implemented as a table lookup finite state machine. In Table 1, a simple four-state encoder is shown. Each state is represented by an interval; the starting state is represented by interval [0,8) (i.e., L=0, H=8), while the other three possible states are represented by intervals [1,8), [2,8) and [3,8). Here, states of the form [k,N) where k<N/2 are used. Therefore, a four-state machine implies that the starting interval is [0,8). For each state, different outputs and transitions exist depending on the input bit and the probability of the input.

TABLE 1

Example encoding machine

| State | Prob(MPB) | LPB | MPB |
|---|---|---|---|
| [0,8) | [0.8125,1) | 000, [0,8) | –, [1,8) |
|  | [0.625,0.8125) | 00, [0,8) | –, [2,8) |
|  | [0.5,0.625) | 0, [0,8) | 1, [0,8) |
| [1,8) | [0.7857,1) | 001, [0,8) | –, [2,8) |
|  | [0.6429,0.7857) | 0f, [0,8) | –, [3,8) |
|  | [0.5,0.6429) | 0, [2,8) | 1, [0,8) |
| [2,8) | [0.75,1) | 010, [0,8) | –, [3,8) |
|  | [0.5,0.75) | 01 [0,8) | 1, [0,8) |
| [3,8) | [0.7,1) | 011, [0,8) | 1, [0,8) |
|  | [0.5,0.7) | ff, [0,8) | 1, [2,8) |

The probability ranges are shown in the second column. The input bit is either the most probable bit (MPB) or the least probable bit (LPB). For each input, the third and the fourth column show the output bits and the next state, represented by an interval. The symbol "f" denotes the "bits to follow technique", meaning the output is not yet known and depends on the next output bit. If the next output bit is zero, then "f" should be replaced by a one, and vice versa.

For example, in TMS320C6x, the binary code for instruction "ADD.D1 0x0, A4, A0" is 0x30100941, which is 00110000 00010000 00001001 01000001 in binary format. For first byte 00110000, the probability of each bit being "0" is given by the following list: 0.9, 0.8, 0.3, 0.6, 0.9, 0.3, 0.7, 0.7, where the first bit is "0" with a probability of 0.9, the second bit is "0" with a probability of 0.8, and so on.

Table 2 shows the encoding process for the first byte. Compression starts from state [0,8). The most probability symbol (MPB) is "0", with probability 0.9, and the input bit is MPB. Therefore, in Table 1, the MPB column is used, as is the first row for state [0,8), such that the result is no output (denoted by "–" in the table), and the next state is [1,8). Continuing in this manner, the first byte of the instruction is compressed to 100f1. Since the "f" is followed by "1", it is replaced by "0", such that the final compressed code for the first byte is 10001.

TABLE 2

Encoding example

| Present State | Input | MPB | Prob(MPB) | Output | Next State |
|---|---|---|---|---|---|
| [0,8) | 0 | 0 | 0.9 | — | [1,8) |
| [1,8) | 0 | 0 | 0.8 | — | [2,8) |
| [2,8) | 1 | 1 | 0.7 | 1 | [0,8) |
| [0,8) | 1 | 0 | 0.6 | 0 | [0,8) |
| [0,8) | 0 | 0 | 0.9 | — | [1,8) |

TABLE 2-continued

Encoding example

| Present State | Input | MPB | Prob(MPB) | Output | Next State |
|---|---|---|---|---|---|
| [1,8) | 0 | 1 | 0.7 | 0f | [0,8) |
| [0,8) | 0 | 0 | 0.7 | — | [2,8) |
| [2,8) | 0 | 0 | 0.7 | 1 | [0,8) |

Using the same table, and the same probability model, the input binary stream can be decoded back. A decoding machine for the encoder in Table 1 is shown in Tabb 3. Both the encoded binary stream and the probability model are available to the decoder. The third column in the table shows the input bits to be decoded, the output bits, and how many bits are to be shifted out for the encoded binary stream (because they have been decoded). The fourth column shows the next state. Table 4 gives the decoding process for the same example, as shown in Table 2.

TABLE 3

Example decoding machine

| State | Prob(MPB) | Input/Output/shift | NextState |
|---|---|---|---|
| [0,8) | [0.8125,1) | 000/LPB/3 | [0,8) |
|  |  | –/MPB/0 | [1,8) |
|  | [0.625,0.8125) | 00/LPB/2 | [0,8) |
|  |  | –/MPB/0 | [2,8) |
|  | [0.5,0.625) | 0/LPB/1 | [0,8) |
|  |  | 1/MPB/1 | [0,8) |
| [1,8) | [0.7857,1) | 001/LPB/3 | [0,8) |
|  |  | –/MPB/0 | [2,8) |
|  | [0.6429,0.7857) | 0f/LPB/2 | [0,8) |
|  |  | –/MPB/0 | [3,8) |
|  | [0.5,0.6429) | 0/LPB/1 | [2,8) |
|  |  | 1/MPB/1 | [0,8) |
| [2,8) | [0.75,1) | 010/LPB/3 | [0,8) |
|  |  | –/MPB/0 | [3,8) |
|  | [0.5,0.75) | 01/LPB/2 | [0,8) |
|  |  | 1/MPB/1 | [0,8) |
| [3,8) | [0.7,1) | 011/LPB/3 | [0,8) |
|  |  | 1/MPB/1 | [0,8) |
|  | [0.5,0.7) | ff/LPB/2 | [0,8) |
|  |  | 1/MPB/2 | [2,8) |

TABLE 4

Decoding example

| PS | encoded bits | MPB | Prob(MPB) | Decoded bit | bits to shift | NS |
|---|---|---|---|---|---|---|
| [0,8) | 10001 | 0 | 0.9 | 0 (MPB) | 0 | [1,8) |
| [1,8) | 10001 | 0 | 0.8 | 0 (MPB) | 0 | [2,8) |
| [2,8) | 10001 | 1 | 0.7 | 1 (MPB) | 1 | [0,8) |
| [0,8) | 0001 | 0 | 0.6 | 1 (LPB) | 1 | [0,8) |
| [0,8) | 001 | 0 | 0.9 | 0 (MPB) | 0 | [1,8) |
| [1,8) | 001 | 1 | 0.7 | 0 (LPB) | 2 | [0,8) |
| [0,8) | 1 | 0 | 0.7 | 0 (MPB) | 0 | [2,8) |
| [2,8) | 1 | 0 | 0.7 | 0 (MPB) | 1 | [0,8) |

1.2 Probability Model for Code Compression

Probabilities feeding the finite state code are provided by a probability model. The fundamental role of a probability model is to store the statistical properties of the source, so compression is more effective.

In code compression, though the program is compressed block by block, if program compression is done off-line when loading the program in memory, a global probability model can be used for the whole program. In the present invention, a suitable probability model is built for the whole program, the probability model then used to facilitate compression and decompression of small blocks.

1.2.1 Static iid (Independent and Identical Distribution) Models

A static model is a fixed model that fits all applications. The probability model is determined in advance from some sample applications.

The simplest probability model is the one that assumes ones and zeros in the code have independent and identical distribution, and therefore allocates a fixed probability for bit 1 and bit 0 irrespective of its position within instructions. Through experimentation on a number of benchmarks, it is observed that, for a specific instruction set architecture, the distribution of ones and zeros falls within a certain range. Static models will give poor compression whenever statistics collected from sample inputs do not accurately match the input to be compressed; however, experimental results indicate that for IA-64 instructions, the probability of a bit being zero "P(0)" is around 83%, and for TMS320C6x, the average probability of a bit being zero "P(0)" is about 75%, with small deviation. Therefore, based on the iid assumption, P(0)=0.75 and P(0)=0.83 can be used for TMS320C6x and IA-64 applications, respectively.

According to Shannon's information theory, the entropy, represented by $-\Sigma p(i)\log_2 p(i)$, decides the compressibility. Applying the same (simplest) model to other architectures, CISC ISA (represented by Intel x86 ISA) has less compressibility, due to its complicated instruction set, while RISC architectures and VLIW architectures have a more skewed P(0), implying more redundancy. A Thumb instruction set architecture is a modified RISC architecture targeting code density reduction, the redundancy between regular RISC architectures (such as SHARC and SPARC) and CISC architectures.

Another static probability model assumes the probability of a bit being zero or one is related to its position within a byte or within an instruction. Using this model, a bit-wise probability within a byte or within an instruction boundary is calculated, where it is found that at some positions it is highly possible that the bit is zero. For simplicity, these two static models are referred to as a "one-bit model", and a "32-bit model," respectively. Accordingly, an n-bit model is defined to be a static model calculating an iid distribution within an n-bit chunk.

For a detailed review of probability observations for the above-referenced benchmarks and architectures, see Y. Xie, *Code Compression Algorithms and Architectures for Embedded Systems*, Ph.D. dissertation, Princeton University, 2002, which is incorporated by reference for its useful background information.

1.2.2 Semi-Adaptive Finite-State Models

Semi-adaptive modeling addresses the drawback of static modeling by building a statistical model for each source. Compression using a semi-adaptive model is usually called two-pass coding, because the source is scanned first to build the model, and then scanned again to perform actual coding. Semi-adaptive modeling provides better compression because the probability set is tailored for each different source respectively. Semi-adaptive modeling does not, however, have better accuracy than static modeling if one assumes that distribution is independent and identical. For background information on tie code compression algorithms presented in this section, see H. Lekatsas, *Code Compression for Embedded Systems*, Ph.D. dissertation, Princeton University, 2000; and H. Lekatsas, C. Lefurgy, W. Wolf, and T. Mudge, *Code Compression: methods, performance* and *analysis*, ACM Transaction in Embedded Computing Systems, September 2002, each of which are incorporated by reference.

The static iid model does not account for relationship and dependency among input symbols. A more complicated statistical probability model can be represented by a Markov model, which consists of a number of states, where each state is connected to other states via two transitions. Starting from an initial state 0, the binary input stream is scanned. The left transition is taken when the input bit is 0 and right transition is taken when the input bit is 1. The number of transitions are recorded and used to calculate the probability for each transition. The Markov model helps store information about previous bits when encoding. The path followed when traversing the Markov model shows the history of input bits. The Markov model is sophisticated, and can catch dependencies between the current bit and the previous bits, therefore providing good compression efficiency for the coder.

Figure 2:
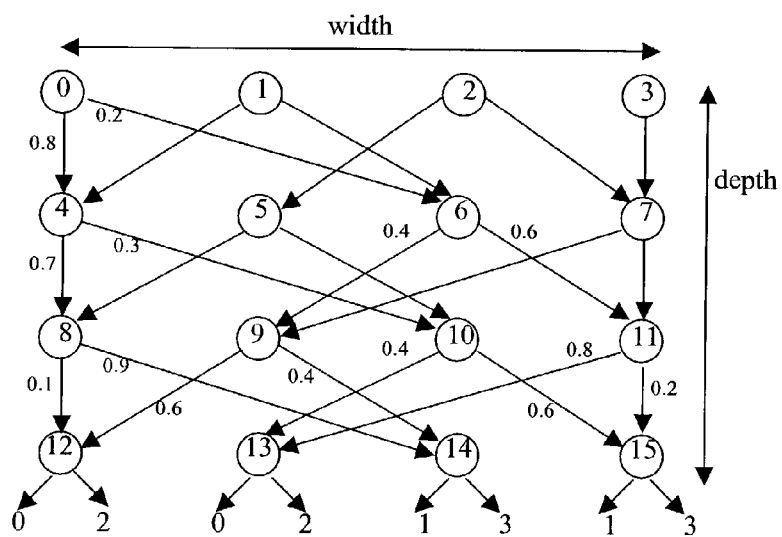
FIG. 2 illustrates an example of 4×4 Markov model.

Two main variables are used to describe a Markov model: the model depth and the model width, the depth and width representing a number of layers and a number of Markov nodes per layer, respectively. Intuitively, the depth should divide the instruction size evenly, or be multiples of the instruction size, since it is desirable that the model start at exactly the same layer after a certain number of instructions, such that each layer corresponds to a certain bit in the instruction, and therefore store the statistics for this bit. The model's width is a measure of the model's ability to remember the path to a certain node. A Markov model with depth=M and width=N is denoted as an M×N Markov model. FIG. 2 is an example of a 4×4 Markov model.

Note that not all transition probabilities are shown in FIG. 2. The probability calculation is done as a preprocessing step. The application code is proceeded through once, and paths are traversed according to the bits encountered in the program. The probability for each transition is then calculated. Once the model is built, the compression process starts, the compression process going through the program a second time, using the probability provided by the model and the finite state machine (FSM) table, such as the one in Table 3.

Figure 3:
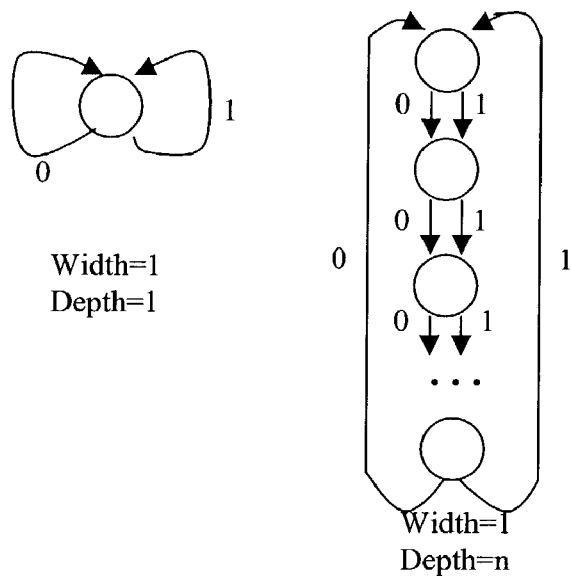
FIG. 3 illustrates a one-bit model and a 32-bit model as special cases of the Markov model.
Figure 6:
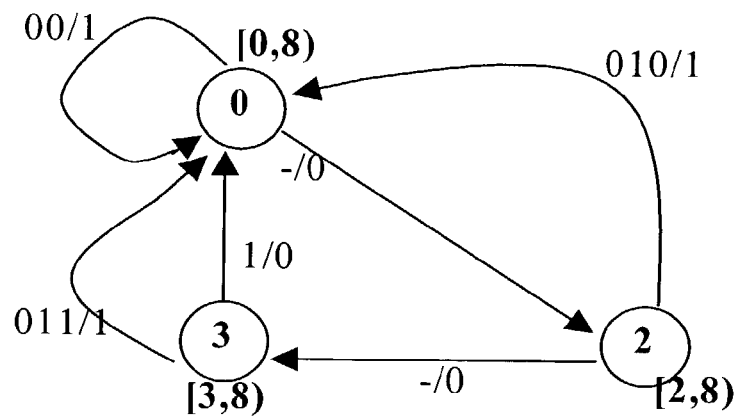
FIG. 6 illustrates the decoder of Table 3, simplified to a three-state FSM machine as in Table 6.

Referring to FIG. 3, note that the individual and identical distribution model (the one-bit model) is a special case of Markov model where only one state exists in the model. The n-bit model, such as the 32-bit model shown in FIG. 6, is another special case of Markov model where the width is one and the depth is n.

1.3 Compressing VLIW Instructions

Binary instructions are compressed block by block to enable random access. At the end of each block, bits are added to preserve byte-alignment and to ensure the decoder can decode the block correctly. If the size of compressed block is not smaller than the size of original uncompressed block, the block is left uncompressed.

1.3.1 Compressing Instructions Using Static Models

Compressing instructions using static models is a two-step scheme:
  1. Statistics-gathering phase: First, a set of sample programs are chosen for a specific instruction set architecture. Assuming the probability distribution is independent and identical (iid), probabilities are calculated and the static model takes the average of the probabilities. For example, using a one bit iid model, P(0) is 0.75 for TMS320C6x and 0.83 for IA-64 ISA.

Figure 4:
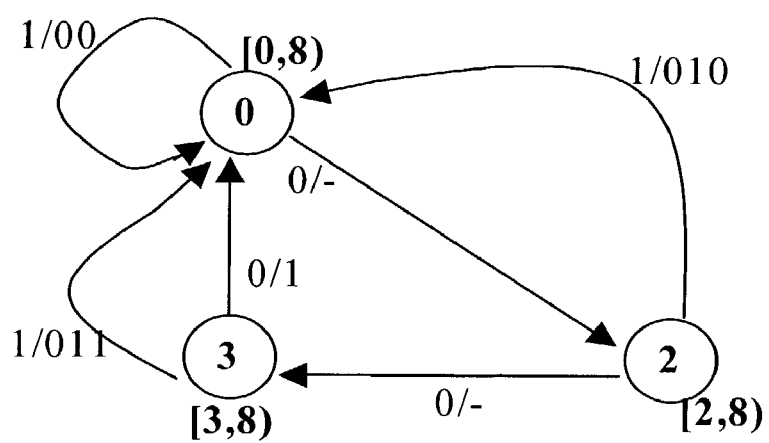
FIG. 4 illustrates a simplified three-state finite state machine (FSM) encoder.

2. Compression phase: The static model constructed from the first step is used for all applications for the same instruction set architecture. An N-state encoder, like that shown in Table 1, is chosen and simplified using the static model. An N-state encoder can be simplified by removing those states and transitions never reached. For example, for TMS320C6x, a one-bit iid model gives P(1)=0.25 and P(0)=0.75. The encoder of Table 1 can be simplified to a three-state FSM machine, as in FIG. 4, since state [1,8) and other transitions are never reached. Note that coder simplification might not be possible for a more complicated static model, such as a 32-bit model. Instructions are compressed block by block. At the beginning of each block, the FSM is reset to state 0 so that the decoder can start decompression at the block boundary.

Note that in step one, the statistics-gathering phase is only executed in advance to construct the static model. The model is fixed for a specific instruction set architecture and never changed again.

1.3.2 Compressing Instructions Using Semi-Adaptive Markov Models

Compressing instructions using semi-adaptive Markov models is described as follows:

1. Statistics-gathering phase: Choosing the width and depth for the Markov model. State 0 is the initial state corresponding to no input bits. Its left and right child correspond to "0 input"' and "1 input"', respectively. Each transition has a probability generated by going through the whole program. Probabilities need only be stored on the left branches of the tree since the probabilities on the right branches are the complements of the probabilities on the left branches.

2. Compression phase: Instructions are compressed block by block. At the beginning of each block, the Markov model and the encoder are both reset to initial state, ensuring that the decoder can start decompressing at any block boundary.

Note that for semi-adaptive Markov models, the procedure is a two-pass process: the program is first scanned to gather statistics and then scanned again to perform compression.

1.3.3 Compressing With Tags

Decompression speed is critical when VLIW processors execute compressed code, because of the processor's ability to execute multiple operations simultaneously. Although the block is the unit compressed and decompressed, the present invention divides the block into smaller sub-blocks, the sub-blocks being compressed and decompressed in parallel. Compression and decompression inside each sub-block is sequential.

For example, using a fetch packet size as the block size, the fetch packet is divided into sub-blocks. One or more tags are attached to a front of the compressed fetch packet, the tags indicating the size of each compressed sub-block so that the decompressor knows the location of each compressed sub-block. Accordingly, each compressed sub-block can be decompressed simultaneously.

Figure 5:
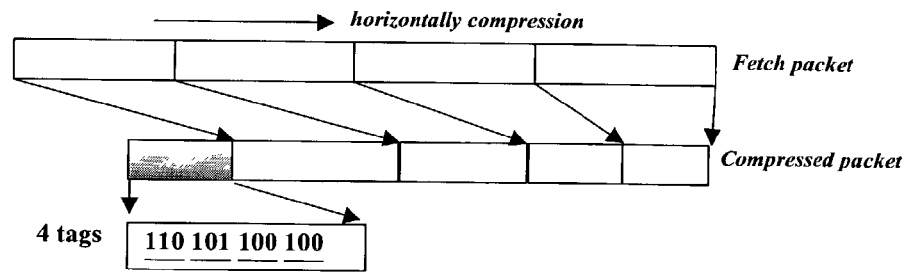
FIG. 5 illustrates compression of a fetch packet with tags for TMS320C6x.

FIG. 5 illustrates a 256-bit long fetch packet in TMS320c6x, the fetch packet divided into four sub-blocks, each sub-block having two instructions with eight bytes. Twelve (12) bits are attached to the front of the compressed fetch packet, every three-bit tag indicating a number of bytes for a respective compressed sub-block. FIG. 5 shows that the four, eight-byte sub-blocks are compressed into six, five, four, and four bytes, respectively. This scheme will sacrifice some compression ratio, since smaller blocks (i.e., sub-blocks) normally have less compressibility than larger blocks, and the attached tags use some space, but four smaller blocks (i.e., sub-blocks) can be decompressed simultaneously.

1.3.4 Experimental Result

Compression for TMS320C6x

Compression ratios for TMS320C6x using a semi-adaptive Markov model with depth=32, width=4, and block size of 32 bytes averages 67%. In comparison, Huffman coding and Gzip (LZ77 coding algorithm) compress the whole program without dividing the file into blocks. The Huffman encoder is byte-based (i.e., the input programs are broken into symbols equal to one byte and a Huffman table is used to compress them). The Huffman table is generated semi-adaptively, and is therefore unique for each application. Average compression ratio achieved by the present invention is about 15% less than Gzip, and about 8% better than Huffman coding. Gzip does not require block constraint, and can therefore compress much more effectively since it can take advantage of long repeating sequences in the files. Although most effective among the three algorithms compared, Gzip is unsuitable for compressing small blocks. The algorithm of the present invention outperforms Huffman coding, since the Huffman encoder does not account for dependencies between bytes, hence its performance is limited.

Among techniques of the present invention for TMS320C6x, the compression ratio for the one-bit static model is about 13% less than that achieved by the semi-adaptive Markov model. When implementing the compression with tag scheme (where the fetch packet is divided into four sub-blocks with a tag attached to the compressed fetch packet to allow the four sub-blocks to be decompressed in parallel), about 7% compression ratio is sacrificed, but decompression time is only about 25% of the scheme not dividing the fetch packet, as parallel decompression is achieved with tagging, and the four sub-blocks are decompressed simultaneously. For a detailed presentation of experimental results directed to compression for TMS320C6x, see Y. Xie, *Code Compression Algorithms and Architectures for Embedded Systems*, Ph.D. dissertation, Princeton University, 2002, which is incorporated by reference.

1.4 Decompression Architecture Design.

Using the same encoder table and probability model shown in Table 4, the decoder can easily decompress the compressed code. Decompression, however, works on a bit-by-bit basis, resulting in slow decoding. The following are multi-bit decompression algorithms for simple models, and Markov models, respectively:

1.4.1 Multi-Bit Decompression Algorithm for Static Models

First, check to see if the decoder can be simplified. An N-state decoder table, as shown in Table 3, can be simplified by removing those states and transitions never reached. For example, for TMS320C6x, a one-bit iid model gives P(1)=0.25 and P(0)=0.75. The decoder of Table 3 is simplified to a three-state FSM machine, as in Table 5 and FIG. 6, by removing state [1,8) and other transitions never reached, and replacing LPB with 1 and MPB with 0. It might not be possible to simplify the coder for a more complicated static model, such as a 32-bit model.

Figure 7:
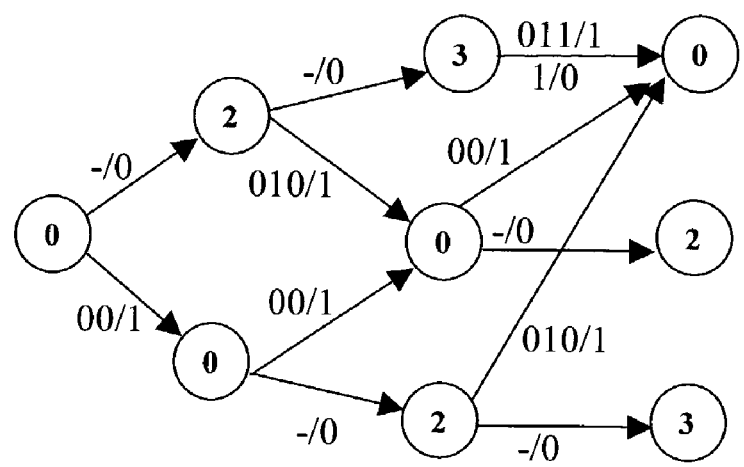
FIG. 7 illustrates a decoder tree with depth=3 for the FSM in FIG. 6.

The next step is to build a decoder tree by following all possible paths starting from state 0 (for simplicity, state [i,8] is denoted state "i" in the following discussion), since state 0 is always a starting point when beginning compression/decompression of a block. FIG. 7 shows a decoder tree with depth=3 for the FSM in FIG. 6.

TABLE 5

Simplified decoding machine for static model

| State | Input/Output/shift | NextState |
|---|---|---|
| [0,8] | 00/1/2 | [0,8] |
|  | –/0/0 | [2,8] |
| [2,8] | 010/1/3 | [0,8] |
|  | –/0/0 | [3,8] |
| [3,8] | 011/1/3 | [0,8] |
|  | 1/0/1 | [0,8] |

Figure 8:
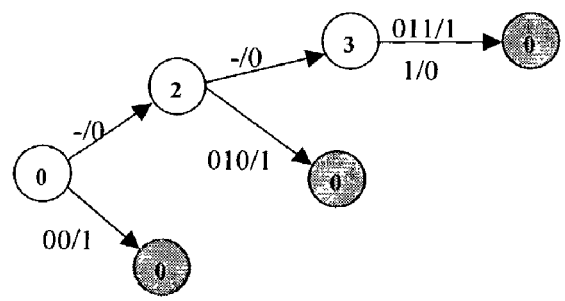
FIG. 8 illustrates a subset of a decoder tree that generates the multiple bits decoder FSM in Table 6.

Based on the decoder tree, a multi-bit decoder is designed. For example, it is easy to show that if the encoded bits are 011, the decoder produces output 001. Using a subset of the decoder tree (see FIG. 8), where all ending nodes are state 0, a multiple-bit decoder FSM with four transitions is constructed, as shown in Table 6. Note that each transition comes back to state 0. Therefore, the decoder is a one-state FSM with four transitions back to itself.

TABLE 6

Example multiple bits decoder for static model

| Current State | Encoded bits | Decoded bits | Shift | Next State |
|---|---|---|---|---|
| 0 | 1 | 000 | 1 | 0 |
|  | 011 | 001 | 3 | 0 |
|  | 010 | 01 | 3 | 0 |
|  | 00 | 1 | 1 | 0 |

The encoder tree can further be expanded to get more bits decoded at each clock cycle. Though it is not necessary, an attempt can be made to ensure that the ending nodes in subset of the decoder tree are all state 0, such that the resulting decoder is a one state FSM with more transitions. For example, a one-state FSM with 21 transitions can decode up to six bits at each cycle.

TABLE 7

A multiple bits decoder table not parsable for all binary streams

| Current State | Encoded bits | Decoded bits | Shift | Next state |
|---|---|---|---|---|
| 0 | 1 | 000 | 1 | 0 |
|  | 011 | 001 | 3 | 0 |
|  | 010 | 01 | 3 | 0 |
|  | 0000 | 11 | 4 | 0 |

Figure 9:
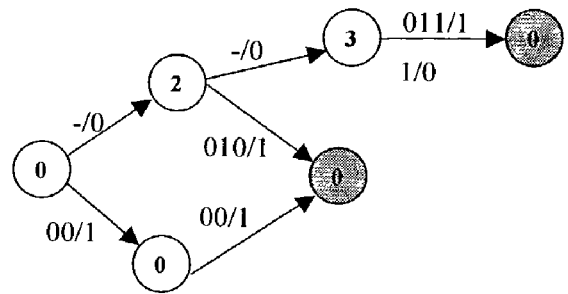
FIG. 9 illustrates an incomplete subset decoder tree that generates the decoder in Table 7.
Figure 10:
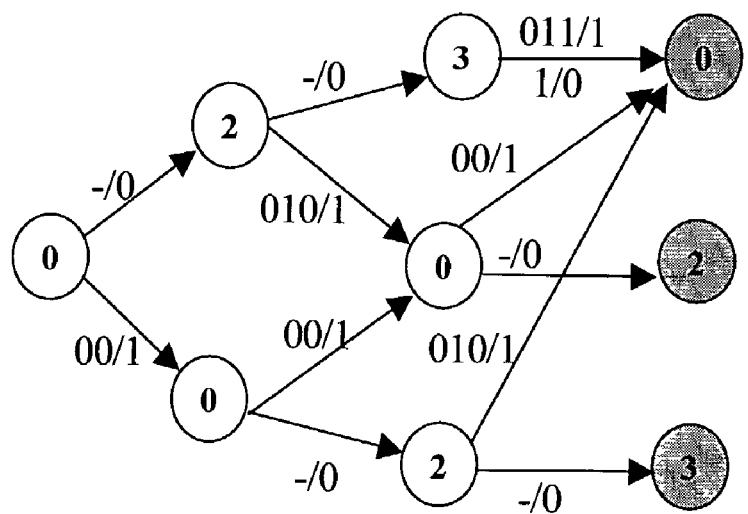
FIG. 10 illustrates a decoder tree that results in the decoder table entry in 8.

When designing such a multiple-bit decoder, two issues are pertinent:

Any compressed binary stream should be decodable: Any compressed binary stream should be parsable by the multi-bit decoder (i.e., any binary stream should be decodable). For example, using the multi-bit decoder table in Table 7, input bits 001 cannot find a matched transition in the table, and cannot be decoded (although decoding is possible to 1000 by Table 6). To ensure that all binary streams are decodable, when designing the decoder table, one must choose a subset of the decoder tree such that all transitions from the nodes in the subset are ended within the subset, except for the ending nodes. Such a subset tree is defined to be complete. FIG. 9 shows the uncomplete subset tree that generates the invalid decoder table in Table 7.

Figure 11:
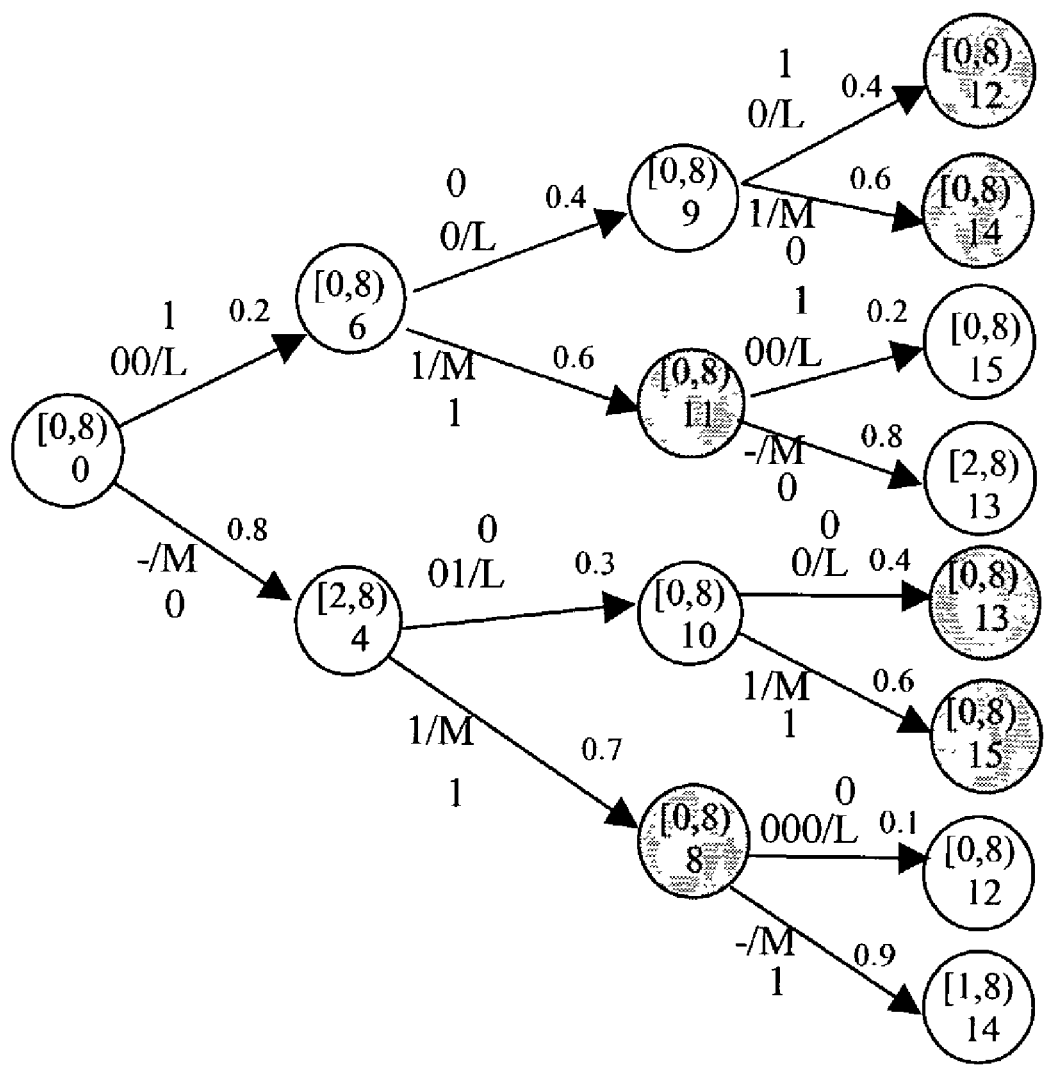
FIG. 11 illustrates a decoder tree combining decoder table and Markov model.

Any compressed binary stream must be distinguishable: Taking third level nodes (state 0, state 2 and state 3) as the ending nodes, as shown in FIG. 11, the decoder tree is complete. The resulting decoder table is shown in Table 8. If the input bits are 000000, there are several ways of parsing: the first two bits 00 are decoded as 100, and the next state is 3; or the first four bits 0000 are decoded as 110, and the next state is 2; or, the whole six bits are decoded as 111, and the next state is 0. The decoder cannot differentiate these situations. To avoid this problem, the subset decoder tree must satisfy the following requirements:

1. Ending nodes in the subset tree cannot have an in-edge with empty input (i.e., the "–" on the transition edge); and
2. No transition between ending nodes (otherwise, the decoder cannot distinguish which ending node is the next state).

TABLE 8

An invalid decoder table entry that can not distinguish all binary streams

| Current State | Encoded bits | Decoded bits | Shift | Next State |
|---|---|---|---|---|
| 0 | 1 | 000 | 1 | 0 |
|  | 011 | 001 | 3 | 0 |
|  | 01000 | 011 | 5 | 0 |
|  | 010 | 010 | 3 | 2 |
|  | 000000 | 111 | 6 | 0 |
|  | 0000 | 110 | 4 | 2 |
|  | 00010 | 101 | 5 | 0 |
|  | 00 | 100 | 2 | 3 |

For other N-bit models, the encoder tree is constructed in the same manner. Note that states having the same name, but exist at different depths, are not identical, since the probability is not the same at each level. For an N-bit model, the resulting decoder is an N-state FSM with multiple transitions for each state. The number of transitions for the FSM depends on the number of bits simultaneously decoded.

1.4.2 Multi-Bit Decompression Algorithm for Markov Models

For adaptive Markov modelling, the multi-bit decompression scheme is more complicated than for static modelling.

The Markov model and a finite state machine decoder table, such as that of Table 3 and FIG. 2, are combined into one decoder tree. FIG. 11 shows an example decoder tree. Decoding starts at Markov state 0 and FSM state [0,8); the left outedge is for bit 0 and the right out-edge for bit 1, with probability 0.8 and 0.2, respectively. Table 3 illustrates that, when the encoded bits are 00, the decoded bit is the LPB (Least Probable Bit), denoted L in FIG. 11); the next decoder state is [0,8), and the encoded bits are shifted out tow bits; otherwise, the output bit is MPB (Most Probable Bit, denoted as M in FIG. 11), the next decoder state is [2,8) and no shift for encoded bits. Following in the same manner, a decoder tree is constructed, and each node in the decoder tree is a combination of one encoder state in Table 3 and one Markov state in FIG. 2.

After constructing the decoder tree, a multiple bit decoder table is extracted, following the requirements and procedure discussed in the previous section. For example, the selected ending nodes are those with shadow ones. The corresponding decoder entry in the decoder table is shown in Table 9. The entry has six matches (transitions). For example, if the encoded bit stream is 1010, then the first bit "1" matches the first match in this entry and can be decoded as MM(01). One bit of the encoded bit stream is shifted, and the next entry state is "[0,8), 8".

TABLE 9

An example decoder table entry for state {[8,0),0}

| Current State | Encoded bits | Decoded bits | Shift | Next State |
|---|---|---|---|---|
| [0,8),0 | 1 | MM(01) | 1 | [0,8),8 |
| | 010 | MLL(000) | 3 | [0,8),13 |
| | 011 | MLM(001) | 3 | [0,8),15 |
| | 001 | LM(11) | 3 | [0,8),11 |
| | 0000 | LLL(101) | 4 | [0,8),12 |
| | 0001 | LLM(100) | 4 | [0,8),14 |

Table 9 only shows the entry for state {[8,0),0}. Each entry state in the decoder table is a combination of one encoder state and one Markov state. The upper bound of the number of the entry would be the number of the encoder states multiplied by the number of the Markov states. Clearly, to keep the decoder table small, the number of states in both the FSM and the Markov model must be kept small. In practice, a four-state FSM machine and a 256-state Markov Model achieve good compression ratio and give an upper bound of 1K entries in the decoder table. For each entry, depending on the number of bits to be compared, the number of matches varies. From FIG. 11, it may seem that by looking ahead more symbols, the size of each decoding table entry grows exponentially. Growth is not necessarily exponential, however, as some nodes in the decoder cannot be valid ending nodes, and cannot, therefore, be a valid entry in the decoder table. Accordingly, the total number of matches in the decoder table does not increase exponentially with the depth of the expanded state graph, and the number of entries is fewer than the upper bound (i.e., number of encoder states multiplied by number of Markov states). In practice, many combinations of the FSM states and the Markov states do not appear in the decoder table. Typically, the total entries of the decoder table does not exceed 500, while the maximum number of matches for each entry depends on how many bits can be decoded simultaneously, varying from 1 to 16.

1.4.3 Decompression Architecture Implementations

To improve decompression speed, the block is divided into smaller sub-blocks, the sub-blocks compressed and decompressed in parallel.

1.4.3.1 Implementation of Multi-Bit Decompression for Markov Models

Implementation of a multi-bit decompression scheme using a Markov model is more complicated than when using a static model. Based on the multi-bit decompression scheme, the decoder table has many entries similar to that shown in Table 9. Each entry is a combination of the encoder FSM state and the Markov model state. Each entry has a number of matches. These matches are used to match the encoded bits and produce corresponding decoded bits, to achieve fast decoding where multiple bits are decoded during each cycle. The decoder table is generated during the encoding phase and is application specific, since each application has a distinctive Markov model.

Figure 12:
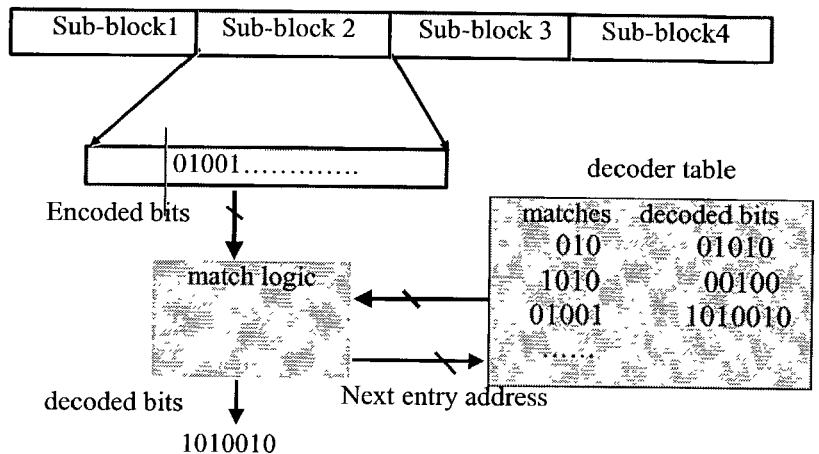
FIG. 12 illustrates a multiple bit decoding process.

The decoding procedure compares the encoded bits stream with the decoder table matches. FIG. 12 shows the decoding process, where the match logic compares the encoded bits with the matches in the decoder table, selects the output and produces the next entry address. Since the decoder table is a variable-to-variable length mapping, the match logic has to know how many bits are to be compared, and, if there is a match, how many bits are to be sent to output and what is the next entry (i.e., the last column of Table 9).

Figure 13:
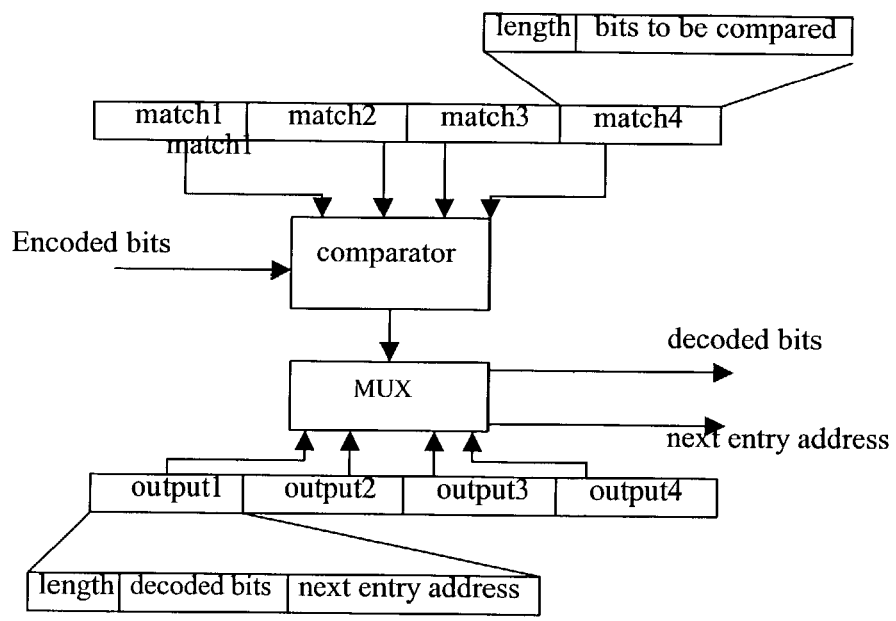
FIG. 13 illustrates match logic performing comparison and multiplexing.

FIG. 13 shows the behavior of the match logic. The matches and outputs are from the decoder table. Each match indicates how many bits are to be compared with the encoded bits and what bits are to be compared. The output includes the decoded bits and the next entry address. The comparator controls the multiplexor, the multiplexor choosing the correct output and sending the next entry address to the decoder table.

RAM or ROM can be used to store the decoder table. Using RAM to implement the decoder table provides the advantage of decoder table updating capability when the application changes. ROM provides the advantage of smaller area than RAM. If the application running on the embedded system is fixed, ROM is selected to implement the decoder table to save area.

Figure 14:
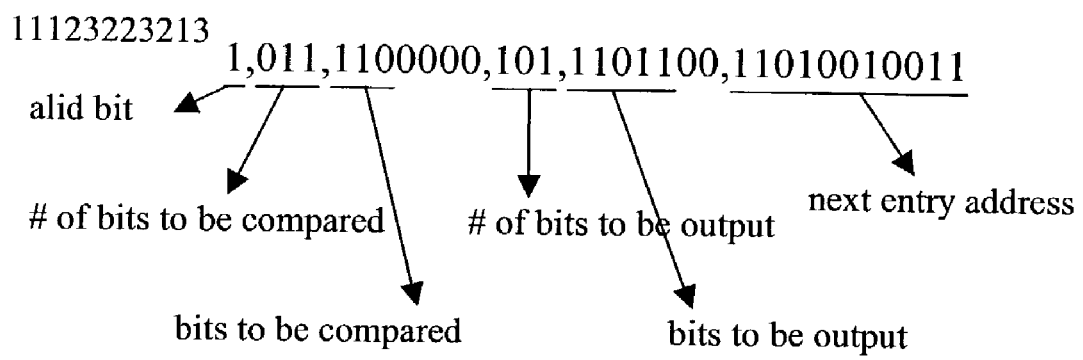
FIG. 14 illustrates one decoder entry stored in RAM/ROM.

The decoder table is stored in the RAM (or ROM), as shown in FIG. 14. Depending on how many bits are to be decoded simultaneously, the way to store the decoder table differs. The arrangement in FIG. 14 assumes that up to seven bits can be matched and up to seven bits of output can be provided at a time. Each word is a match for the entry. The first bit of each word is a valid bit. The match is only valid when this bit is 1. The next three bits indicate how many bits to be compared. Bits 4 to 10 are the bits to be compared. Bits 11 to 13 indicate how many bits to output with a match. Bits 14 to 20 are the output bits. The remaining 11 bits address the next entry. This arrangement allows up to 2K entries in the decoder table (since there are 11 bits for the entry address), and up to seven bits output simultaneously. Some bits are wasted when the number of bits to be matched or the number of bits to be output are less than seven.

Figure 15:
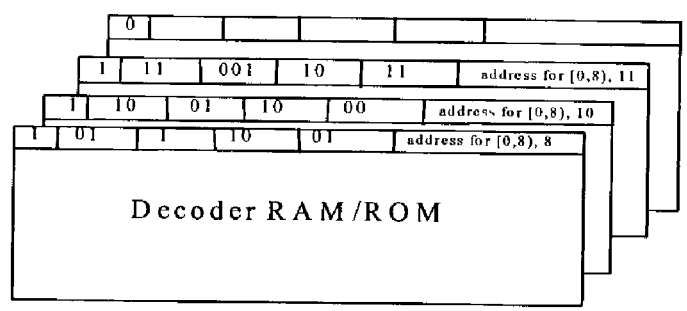
FIG. 15 illustrates a storage of decoder entries in a four-way RAM.

Assume that the maximum matches for each entry is N. To compare the N matches simultaneously, the design of the decoder table is similar to an N-way cache design. FIG. 15 illustrates how decoder entries are stored in a four-way RAM, which assumes the number of maximum matches for each entry is four. Note that this design wastes space when the entry has less than four matches. For example, in this case, only three matches are required and the match with the invalid bit is wasted. Note that only the effective bits are shown in FIG. 15, and the first bit of each match is the valid bit indicating whether the match is a valid match.

Figure 16:
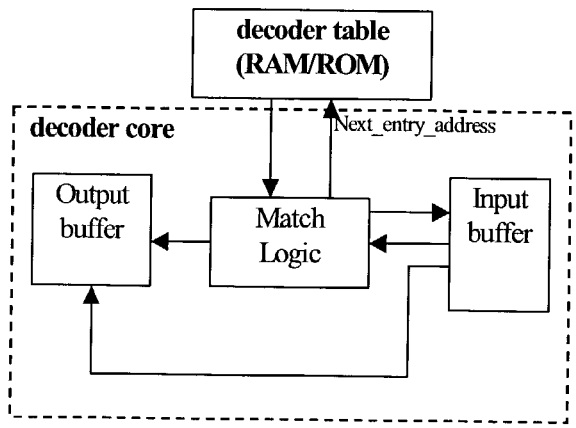
FIG. 16 illustrates a decoder core.

The decoder core is shown in FIG. 16. Input buffer accepts input from instruction memory. If a block is uncompressed, the block is sent to output buffer directly (during compression, if the compressed block size is larger than original block size, the block remains uncompressed). The output buffer also includes a shifter, used to shift the input bits. The output buffer accepts uncompressed instruction from the input buffer directly, or from the decoder through the match logic. The match logic includes N comparators and a N-to-1 multiplexor. The inputs to the match logic are from the decoder table and the input buffer. The multiplexor selects the correct match from the comparators and sends the output bits to the output buffer. The multiplexor also tells the input buffer how many bits have been matched and, therefore, must be shifted out. The next entry address is sent to the decoder table, which is stored in RAM or ROM.

Figure 17:
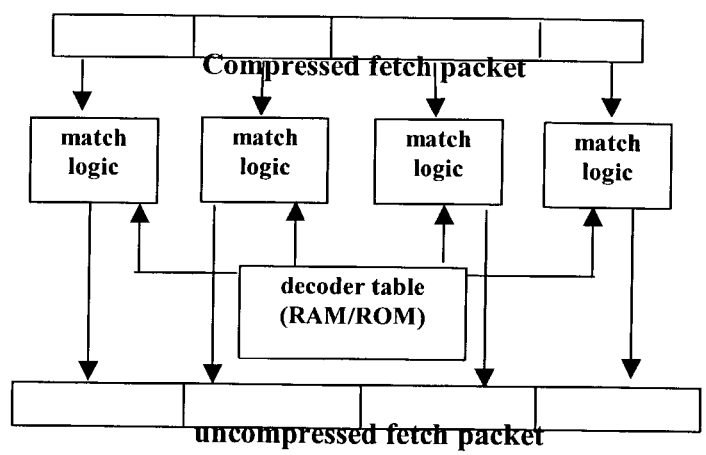
FIG. 17 illustrates a parallel, multiple bit decompression architecture for TMS320C6x.

FIG. 12 shows decoding for one sub-block. FIG. 17 illustrates decoder architecture for TMS320C6x, where a fetch packet is divided into four sub-blocks, and each sub-block can be decompressed simultaneously with other sub-blocks.

Since four match logics share the same decoder table, in FIG. 17, the decoder table must be stored in a four-port RAM/ROM (note: each match logic denoted in FIG. 17 is actually a decoder core of FIG. 16, also including an input and output buffer). This architecture provides four-way parallel decompression. For N-way parallel decompression, N-match logics would share one N-port decoder table.

In one aspect of the present invention, an integrated circuit (chip) is produced based on the architecture described above. The chip is a four-way parallel decoder as shown in FIG. 17. The maximum number of entries, for the four-way parallel decoder shown in FIG. 17, is 512 (which corresponds to the upper bound for a four-state encoder with a 32×4 Markov model), and the maximum matches for each entry is four. The architecture is described in VHDL. Design Compiler by Synopsys was used to synthesize the circuit into gate level netlists, using the TSMC 0.25 standard cell library provided by Artisan. The decoder table is stored in RAM; therefore, the decoder is programmable. RAM is generated by Artisan's high density SRAM generator. Ideally, a four-port RAM would be used for the four-way parallel decoder. However, the SRAM generator from Artisan can only generate dual-port RAMs, therefore two copies of dual-port RAMs are used, resulting in a 16 KB decoder table. The IO pad library (tpz873n_350d) is also provided by Artisan. The gate level netlist is imported into the Silicon Ensemble by Cadence to do placement and routing. The exported GDSII is imported into the layout editor Virtuoso by Cadence and verification is done by Cadence's tools. MOSIS fabricated the chip.

The chip has two working modes: Test/Input mode and Work mode. In Test/Input mode, the Input RAM or the Decoder Table RAM accepts input from the Data Input ports, or the content of any RAM can be observed from the Data Output ports. During the work mode, the chip decompresses the instructions stored in the Input RAM and outputs the decompressed code to the Output RAM.

Figures 18, 19:
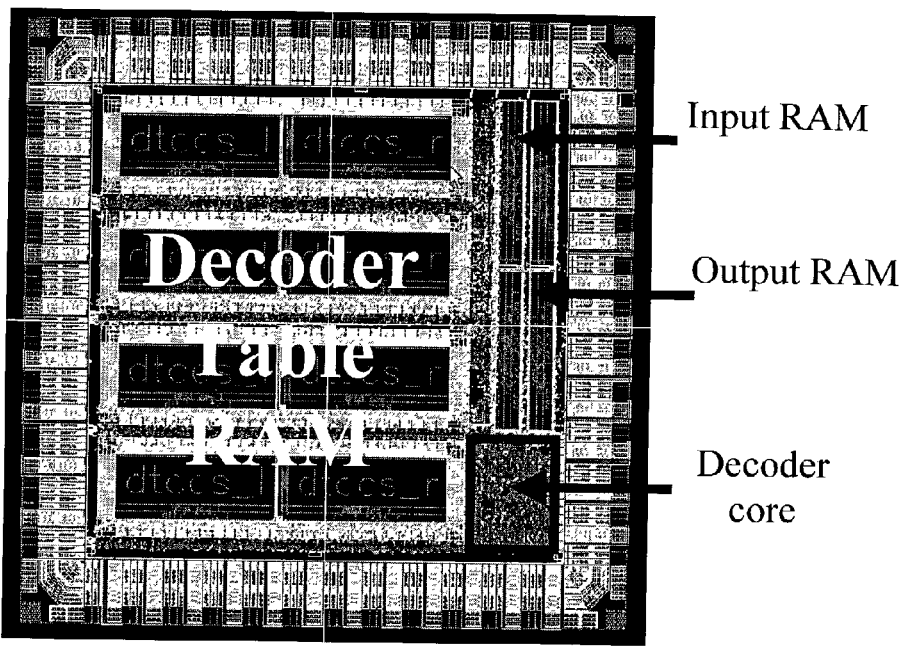
FIG. 18 illustrates an internal circuit embodying the decompression architecture of FIG. 17.
FIG. 19 illustrates a variable-to-fixed length coding table.

FIG. 18 illustrates the chip design. The chip size is 3.4 mm×3.4 mm. FIG. 18 shows that the decoder tables occupy the majority of the silicon area (about 80% of the core area without 10 pads). Ignoring the Input RAM and the Output RAM, the decoder table RAMs occupy about 95% of the decompressor area. Therefore, using a multi-port RAM or ROM to store the decoder table (to be used by all decoder cores) is critical to the design of an area-efficient decoding machine.

Simulation shows that the decoder table RAM can run as fast as 500 Mhz, while the decoder core can run as fast as 45 Mhz. The bottleneck, therefore, is the speed of the decoder core. The average decompression speed is about 11 bits per clock cycle, corresponding to 465 Mbits/sec. Since the size of a fetch packet in TMS320C6x is 256 bits, it takes more than 23 cycles to decompress a fetch packet. Note that the decompressor is placed between the cache and the memory. Decompression occurs, therefore, only when there is a cache miss.

The decompressor embodiment of the present invention is compared with two decompressors for RISC architectures. IBM implemented their decompression core "CodePack" in IBM 0.25 um CMOS technology and the decompression core consists of 25484 logic cells, occupying one $mm^2$ silicon area. The size of the decoder core of the present invention is only about 10% of the CodePack decoder core. IBM reports that their decoder table ROM for two 512-entry tables is 10814 cells, but the silicon area for the decoder table ROM is not mentioned. Had the decoder table of the present invention been implemented in ROM, rather than in RAM, the silicon area for the core would have been smaller. The fast asynchronous Huffman decompressor for CCRP, built by Benes et al., can achieve an average speed at 1303 Mbits/s while consuming less than one mm2 in a 0.8 um full custom layout.

1.4.3.2 Implementation of Multi-Bit Decompression for Static Models

For multi-bit decompression for static models, the structure of the decoder table is similar to that used for the Markov model, but the total number of entries in the decoder is greatly reduced. For instance, considering a four-state encoder combined with a 32×8 Markov model, the upper bound of the number of entries for the decoder table is 1024 (4×32×8). On the contrary, a four-state encoder combined with an eight-bit model has at most 32 entries in the decoder table. In practice, not all combinations occur. For instance, a decoder table for a 32×8 Markov model has about 500 states and an average of 1500 matches when allowing up to three bits to be decoded per cycle. A decoder table for an eight-bit model that allows up to three bits to be decoded per cycle has only eight states and 31 matches. When the decoder table is stored in a decoder ROM, the decoder ROM for an eight-bit model is about 2% of a decoder ROM for a 32×8 Markov model. Accordingly, it is not necessary to store such a small amount of decoder table in a ROM since it is straightforward to design it as a FSM.

Using the same technology (TSMC 0.25), decompression units were implemented for different models. A one-state decoder with 21 transitions can decode up to six bits per cycle, implementation is only 0.01 $mm^2$ with approximately 200 logic cells. The average decompression speed is 4.9 bits per cycle, thus taking an average of 52 cycles to decompress one fetch packet for TMS320C6x. The decoder using an eight-bit model mentioned above is implemented as an eight-state finite state machine and the silicon area is only 0.02 $mm^2$.

Therefore, by using a static model, the decompression unit is much smaller than a decompression unit using a Markov model. Furthermore, a decompression unit using a static model has the significant advantage of not being application specific, therefore not requiring change when the application running on the system changes. The only disadvantage: the compression ratio achieved by a static model decompression unit is not as good as that achieved by a Markov model.

2.0 Variable-To-Fixed Code Compression (V2FCC)

The code compression schemes described in the previous section use a reduced precision arithmetic coding algorithm. Arithmetic coding is a fixed-to-variable coding algorithm. One disadvantage is decompression requires a variable to variable length table look up, making parallel decompression difficult since indexing compressed code is difficult.

This section describes two code compression schemes using variable-to-fixed coding algorithms, one based on modified arithmetic coding and another based on Tunstall coding. Variable-to-fixed coding translates a variable length bit sequence into a fixed length bit sequence, making decompression design easier.

2.1 Fixed-To-Variable Length Coding vs. Variable-To-Fixed Length Coding

Most statistical compression algorithms involve fixed-to-variable (F2V) coding, since these algorithms encode symbols from the source using codewords with a varying number of bits: codewords with fewer bits for frequent symbols and codewords with more bits for less frequent symbols.

Fixed-to-variable (F2V) coding algorithms have the disadvantage of not being indexable. For instance, referring to FIG. 2, one cannot precisely point out where to decompress the second byte of the original code without decompressing the first byte. Accordingly, parallel decompression is difficult, because a chunk boundary does not necessary coincide with a codeword boundary when splitting the compressed code into small chunks and decompressing in parallel. For arithmetic coding presented in the previous section, the decoder table performs variable-to-variable length mapping, implying that the decoder cannot know where to start a next table matching without finishing the current table matching. Therefore, decompression is sequential, always starting from the beginning of a compressed code block.

Variable-to-fixed (V2F) coding is different from Huffman coding and arithmetic coding. Variable-to-fixed coding maps variable-length bit sequences into fixed-length bit sequences, meaning all codewords are of equal length. For example, in FIG. 19, a 32-bit instruction is mapped into several five-bit codewords.

Fixed codeword length is advantageous because the effects of errors are confined to the block and the decoder does not lose synchronism with the next compressed unit. While the corrupted block may be decoded incorrectly, remaining blocks can still be decoded correctly. Huffman and arithmetic coding can suffer catastrophic failure in the presence of errors. This advantage makes variable-to-fixed length coding attractive for communication systems where errors and noise may be introduced in the transmission channel.

Also, since codeword length is fixed with variable-to-fixed coding, indexing into compressed code is easy. FIG. 19 illustrates that compressed code can be divided into five-bit chunks, and each chunk can be decompressed in parallel. Parallel decompression makes V2F coding very attractive for code compression, especially for VLIW architectures, which execute several instructions simultaneously.

2.2 Variable-To-Fixed Coding Algorithms

The design of a binary variable-to-fixed length codebook, such as that in FIG. 19, must satisfy two requirements:

The average length of the binary sequence represented by each codeword should be longer than the codeword length.

Any binary stream should be parsable (i.e., source binary stream can be parsed into binary sequences stored in the codebook).

The first requirement is easily understandable: because the codeword length is fixed, the longer the binary sequence represented by the codeword, the better the compression ratio. Referring to Table 10 for the second requirement, assume the task is encoding binary stream 00001001. First, 000 is encoded to 00, then 01 is encoded to 10. For the next three bits "001", however, there is no codeword in the codebook. For this reason, this binary stream is not parsable by this codebook.

TABLE 10

Example V2F codebook that is not parsable

| Binary sequence | Codeword |
|---|---|
| 000 | 00 |
| 011 | 01 |
| 01 | 10 |
| 1 | 11 |

2.2.1 Tunstall Coding Based V2F Coding Algorithm

The classical variable-to-fixed length coding algorithm is Tunstall coding. Although proposed decades ago, Tunstall coding is not as well known as Huffman coding or arithmetic coding. The present invention uses the same procedure proposed by Tunstall to generate an optimal variable-to-fixed length code for a discrete memoryless source. Assuming the binary stream has independent and identical distribution (iid), and the probability of a bit being 1 is Prob(1), while the probability of a bit being 0 is Prob(0). To construct N-bit Tunstall codewords, the number of codewords is $2^N$, with the algorithm expressed as follows:

1. A tree is created with the root node having probability of 1.0. A "0" and a "1" are attached to the root, two resulting leaf nodes are created, one having a probability of the occurrence of "1", and the other having a probability of the occurrence of "0", represented as P(1) and P(0), respectively.
2. The leaf node with the highest probability is split up into two branches, one labeled "0" and the other "1". After splitting, the number of leaf nodes increases by 1.
3. Step 2 is repeated until the total number of leaf nodes equals $2^N$.
4. Equal length codewords (length=N) are assigned to the leaf nodes. The assignment can be arbitrary, an arbitrary assignment not effecting compression ratio.

Figure 20:
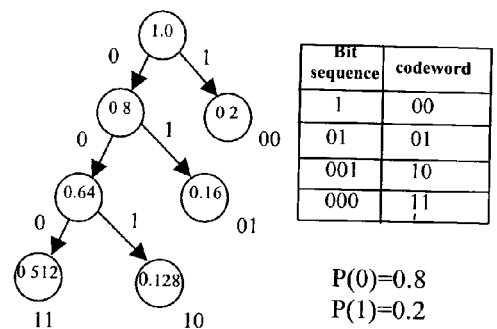
FIG. 20 illustrates a memoryless Tunstall coding tree.

FIG. 20 shows the construction of a two-bit Tunstall code for a binary stream with (iid) probability, wherein the probability of a bit being 0 is 0.8, and the probability of a bit being 1 is 0.2. The code tree expands until there are four leaf nodes. A two-bit codeword is randomly assigned to each leaf node. After the Tunstall codebook is complete, compression of the binary stream is straightforward. For example, the binary stream from the previous example, 000 01 001, which could not be encoded by the codebook of Table 10, is now encoded by the Tunstall coding tree and codebook of FIG. 20 as 11 01 10.

2.2.2 Arithmetic Coding Based V2F Coding Algorithm

Although decoding procedures for standard arithmetic coding can only be sequential, the present invention includes a variable-to-fixed length coding algorithm using modified arithmetic coding, where parallel decoding is possible.

Figure 21:
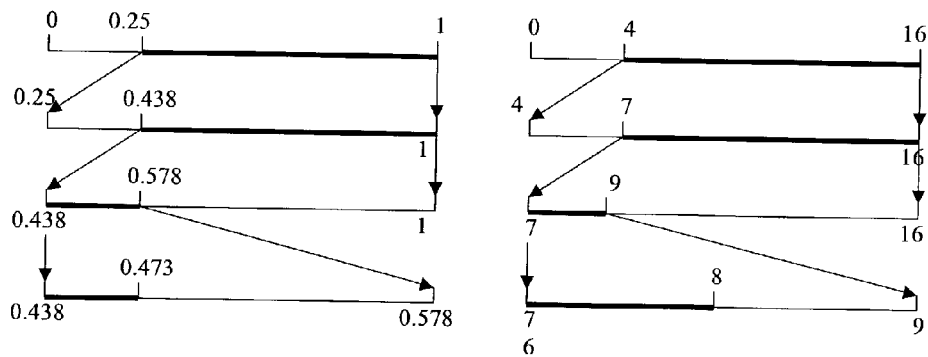
FIG. 21 illustrates encoding of bit stream 1100 using standard arithmetic coding and integer arithmetic coding.

Arithmetic coding divides interval [0,1) recursively according to the probability of 1's and 0's. For each input bit, the sub-interval corresponding to the actually bit is chosen. For instance, in FIG. 21, assuming P(1)=0.75 and P(0)=0.25, 1100 is represented by interval [0.438,0.473).

Standard arithmetic coding involves floating point calculation. The present invention uses integer intervals, rather than real intervals, thereby allowing reduced precision. For example, if the starting interval is chosen as [0,16), the final interval to represent 1100 is [7,8). Note that the third division and the fourth division are not exactly proportional to the probability, since the division is only approximate when allowing for integer intervals.

The variable-to-fixed arithmetic coding algorithm of the present invention is suggested by the Tunstall coding just described. Again, independent and identical distribution (iid) is assumed for the binary stream, the probability of a bit being "1" is Prob(1), and the probability of a bit being "0" is Prob(0). To construct N-bit Tunstall codewords, the number of codewords is $2^N$, with the algorithm expressed as follows:

1. An initial integer interval is created with range $[0,2^N)$. Make the current interval the initial interval.
2. If the current interval is not a unit interval (i.e., [M,M+1)), divide the interval into two sub-intervals, the left sub-interval for input 0 and the right sub-interval for input 1. The size of the sub-intervals is approximately proportional to the probability of the input bit, and each sub-interval should still be an integer interval.
3. Recursively repeat Step 2 for all sub-intervals until all sub-intervals become unit intervals (i.e., [0,1),[1,2),[2,3),etc.).
4. Assign equal length codewords (length=N) to unit intervals. The assignment can be arbitrary, the arbitrary assignment not effecting compression ratio.

Figure 22:
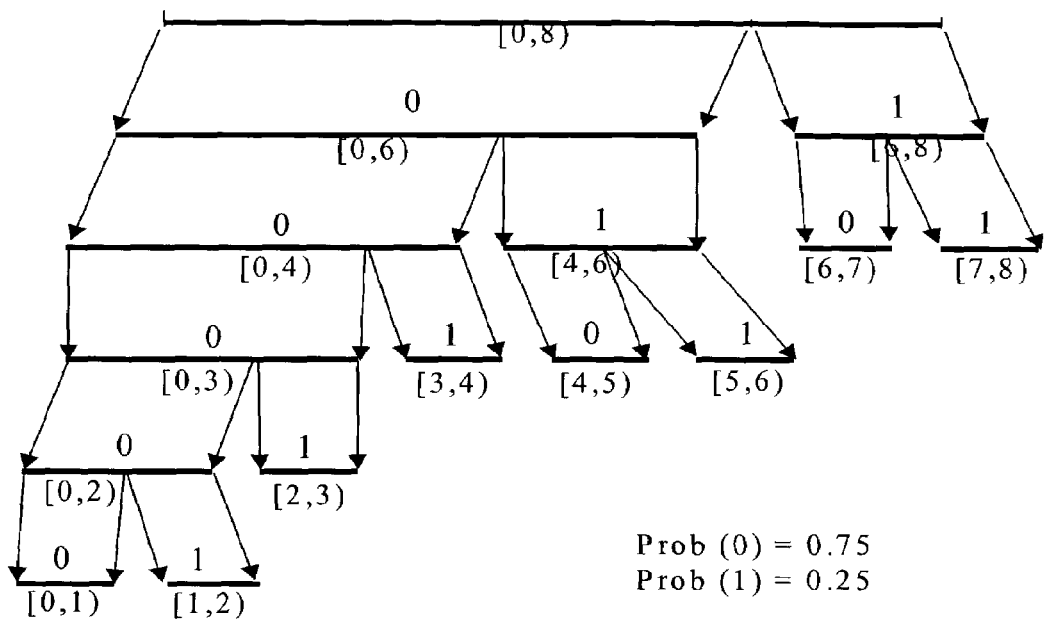
FIG. 22 illustrates integer arithmetic coding and generation of a variable-to-fixed (V2F) codebook with three-bit length codeword for a binary stream with Prob(0)=0.75 and Prob(1)=0.25.
Figure 23:
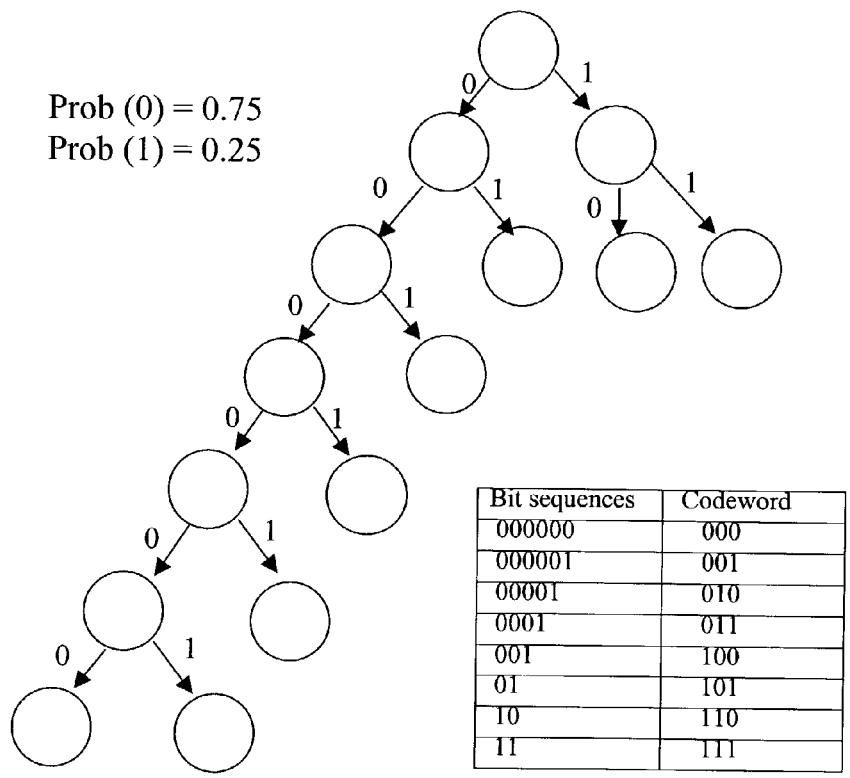
FIG. 23 illustrates a Tunstall coding tree and a generated V2F codebook with three-bit length codeword for a binary stream with Prob(0)=0.75 and Prob(1)=0.25.

Each unit interval is disjoint from all other unit intervals, each unit interval uniquely representing a particular input binary sequence. FIG. 22 illustrates construction of a codebook with a three-bit length codeword for a binary stream with Prob(0)=0.75 and Prob(1)=0.25. FIG. 23 shows a Tunstall coding tree and a corresponding codebook for the same example. Note that the codebooks for the Tunstall and arithmetic variable-to-fixed length coding are different.

2.2.4 Code Compression Using V2F Coding With Static Models

As discussed in section 1.2.1, static (iid) probability models can be used to compress instructions for TMS320Cx and IA64. Ones and zeros in the executable code are assumed to have independent and identical distribution (iid), and the probabilities for ones and zeros are calculated. For example, in TMS320C6x, the probability of a bit being "0" (Prob(0)) is about 75%, and a bit being "1" (Prob(1)) is about 25%; while in IA64, Prob(0)=83% and Prob(1)=17%. In other words, the binary streams are assumed discrete memoryless sources. Therefore, the static (iid) probability model is ISA dependent, based only on the probability of ones and zeros for the ISA.

Instructions are compressed block by block to ensure random access. A fetch packet (256 bits long) is chosen as the basic block for TMS320C6x, and a bundle (128 bits long) is chosen as the basic block for IA-64. A coding tree, such as that shown in FIG. 22 or FIG. 23, is used to compress each block. Starting from the root node, whenever a "1" occurs, the right branch is traversed; otherwise, left branch is traversed. Whenever a leaf node is encountered, a codeword related to that leaf node is produced, and the process restarts from the root node.

During compression two problems must be addressed:

End of Block: Since instructions are compressed block by block, tree traversal can end at a non-leaf node at the end of the block. For example, when restarting from the root node in FIG. 23, if the last several bits in the block are "000", the compression ends at a non-leaf node, and no codeword is produced. To avoid this problem, at the end of each block, when compression ends without reaching a leaf node, extra bits are padded to the block so traversal can continue until a leaf node is met, and a codeword produced. In the example, simply pad a "1" to the original block "000", the last 4 bits "0001" can therefore be encoded to "001". During decompression, the whole block is decoded together with the extra padded bits. However, since the block size is known a priori, the extra bits are simply truncated.

Byte-alignment: To make decompression hardware simpler, and storage of the compressed code easier, the compressed block must be byte aligned. If, after compressing a block, the result is not a multiple of 8 (in bits), a few extra bits are padded to ensure the result is a multiple of 8. This ensures that the next block starts on a byte-aligned boundary.

Using Tunstall coding based V2F compression for TMS320C6x and IA-64, best compression ratio occurs when N=4, where an average of 72.7% for IA64 and 82.5% for TMS320C6x is achieved. As codeword length increases from two bits to four bits long, compression ratio improves. As codeword length continues to increase (N=4), however, compression ratio worsens. Comparing compression ratio for TMS320C6x and IA-64 for a four-bit Tunstall and a four-bit arithmetic based V2F coding, the compression ratio for Tunstall based V2F coding was better than or approximately equal to the compression ratio achieved by arithmetic based V2F coding.

Investigating this result, an average length of the bit sequences represented by the codewords is calculated for each case. Tables 1 and 12 illustrate the results. In both tables, L_T (L_A) is defined as the average length of bit sequences represented by an N-bit codeword using Tunstall coding (arithmetic coding) based V2F compression, and R_T (R_A) denotes the ratio of N over L_T (L_A).

Tables 11 and 12 show that Tunstall coding based V2F compression can always achieve the same or better compression ratio than arithmetic coding based V2F compression, because R_T is always better than or the same as R_A. The tables show that for Tunstall coding based V2F compression, as N increases, R approaches entropy, which means that compression ratio is improved. However, compression ratio improvement is not very significant, especially when N is larger than four. On the other hand, since compression poses a byte alignment restriction for each block, the chance of padding extra bits is reduced by using a four-bit length codeword. Table 13 illustrates padding overhead for various bit lengths. When N=4, padding overhead is less than all other cases except when N=8, where no padding is needed. This explains why best compression ratio is achieved when N=4 in both experiments.

TABLE 11

Average length of bit sequence represented by N-bit codeword for IA-64

| N (bits)      | 2     | 3     | 4     | 5     | 6     | 7      | 8      |
|---------------|-------|-------|-------|-------|-------|--------|--------|
| L_T           | 2.519 | 4.286 | 5.706 | 7.186 | 8.777 | 10.278 | 11.781 |
| R_T = N/L_T   | 0.794 | 0.70  | 0.70  | 0.696 | 0.684 | 0.681  | 0.679  |
| L_A           | 2.519 | 4.286 | 5.636 | 7.154 | 8.714 | 10.236 | 11.742 |
| R_T = N/L_A   | 0.794 | 0.70  | 0.70  | 0.699 | 0.689 | 0.684  | 0.681  |

TABLE 12

Average length of bit sequence represented by N-bit codeword for TMS320C6x

| N (bits)      | 2     | 3     | 4     | 5     | 6     | 7     | 8     |
|---------------|-------|-------|-------|-------|-------|-------|-------|
| L_T           | 2.312 | 3.538 | 4.752 | 5.998 | 7.223 | 8.46  | 9.694 |
| R_T = N/L_T   | 0.865 | 0.848 | 0.842 | 0.834 | 0.831 | 0.827 | 0.825 |

TABLE 12-continued

Average length of bit sequence
represented by N-bit codeword for TMS320C6x

| N (bits) | 2 | 3 | 4 | 5 | 6 | 7 | 8 |
|---|---|---|---|---|---|---|---|
| L_A | 2.312 | 3.488 | 4.752 | 5.973 | 7.216 | 8.442 | 9.681 |
| R_A = N/L_A | 0.865 | 0.860 | 0.842 | 0.837 | 0.831 | 0.829 | 0.826 |

Intuitively, should not better compression ratio be achieved when N=8, since there will be no need to pad extra bits. While this logic prevails, average improvement to compression ratio is less than 1%. Considering that the codebook for N=4 has only $2^4$=16 entries, while the codebook for N=8 has $2^8$=256 entries, the best choice for static V2F code compression uses four-bit length codewords.

TABLE 13

Average padding overhead due to byte-alignment

| N (bits) | 2 | 3 | 4 | 5 | 6 | 7 | 8 |
|---|---|---|---|---|---|---|---|
| Padding_overhead | 2.8% | 3.1% | 1.1% | 2.9% | 2.8% | 2.4% | 0 |

2.3 Markov V2F Code Compression

Tunstall and modified arithmetic coding based V2F compression algorithms are memoryless variable-to-fixed length coding. The probability model assumes that ones and zeros in the executable code have identical and independent distribution (iid). Average compression ratios of 72.7% for IA64 and 82.5% for TMS320C6x are achievable using a four-bit Tunstall coding based V2F compression.

To improve compression ratio, statistical dependencies among bits in the instructions must be exploited, and a more complicated probability model must be employed. Markov models, described in section 1.2, represent one of the most popular ways to represent dependence in data. A new Markov V2F code compression algorithm, combining a V2F coding algorithm with a semi-adaptive Markov model is presented, with the procedure used to compress instructions described as follows:

1. Statistics-gathering phase: This phase chooses width and depth for the Markov model, and decides block size for compression, since instructions are compressed block by block. The first state is the initial state, corresponding to no input bits. A left and right child of the first state correspond to the "0 input'" and "1 input", respectively. By going through the whole program, probabilities for each transition are gathered. Return to the initial state upon starting each new block.
2. Codebook construction phase: After constructing the Markov model, an N-bit variable-to-fixed length coding tree and codebook is generated for each state in the Markov model, using the memoryless algorithms previously described (i.e., either Tunstall or arithmetic V2F coding based). Each state in the Markov model has its own coding tree and codebook. As a result, using an estate Markov model combined with an N-bit variable-to-fixed length coding algorithm results in M codebooks, each codebook having $2^N$ codewords. Similar to the memoryless V2F coding, the codeword assignment can be arbitrary for each codebook of these M codebooks, the arbitrary codeword assignment not effecting compression ratio.
3. Compression phase: Instructions are compressed block by block. The coding tree and the codebook for initial state is always used at the beginning of each block, to ensure that the decoder can start decompressing at any block boundary. Starting from the root of the coding tree for each state, the compression procedure traverses the tree according to the input bits until a leaf node is met. A codeword related to the leaf node is produced, the leaf node being associated with a Markov state. The compression procedure jumps to the root node of the coding tree (and use the code book) starting with that Markov state.

Figure 24:
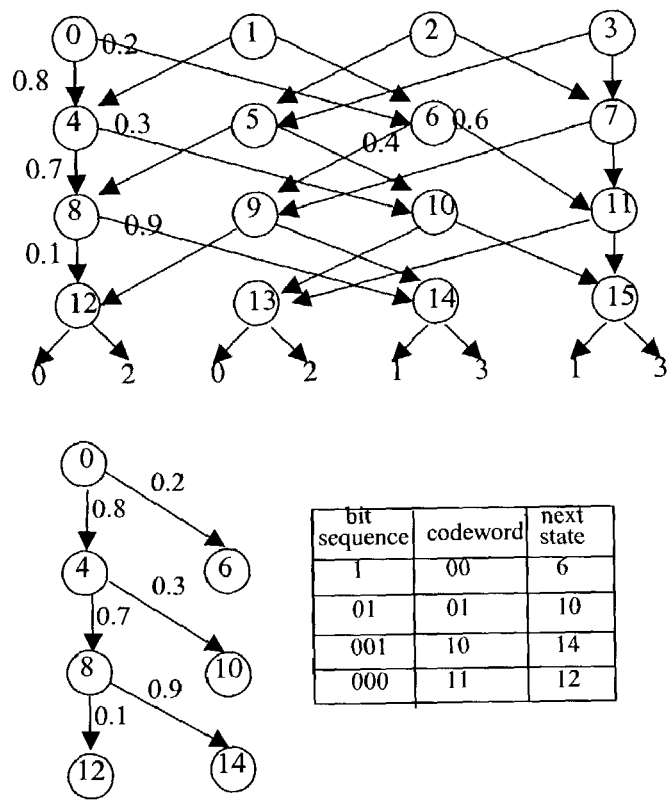
FIG. 24 illustrates a two-bit V2F coding tree and codebook for Markov state 0.

FIG. 24 illustrates a two-bit coding tree, and a codebook for state 0, of the Markov model, using the Tunstall coding based algorithm Compared to FIG. 20, a probability associated with each edge is used here instead of a fixed probability for bit 0 and bit 1. Furthermore, for each codebook entry, the next state must be indicated. For example, starting from state 0, if input is 000, then encoder output is 11 and the next Markov state is 12. The encoder then jumps to the codebook for Markov state 12, and starts encoding using that codebook. Recall that during step two, when constructing the codebook and coding tree for each state, either Tunstall coding or arithmetic coding based V2F algorithm can be used.

2.3.1 Experimental Results

For IA-64 and TMS320C6x benchmarks using a Tunstall based V2F compression scheme and a Markov model, compression ratio improves as codeword length increases, although codebook size doubles when the codeword length increases by 1. When N=4, the average compression ratio is about 56% for IA-64 and about 70% for TMS320C6x. Similar to static V2F coding, when N>4, the compression ratio improvement is not significant (around 1–3% as N increases by one). Considering that codebook size doubles for every N increase of one, N=4 is also the best choice for Markov V2F code compression.

Investigating results for Markov V2F code compression, the Tunstall coding based scheme performs slightly better than the arithmetic based scheme. By using a Markov model rather than a simple 1-bit static model, the compression ratio can be improved about 16% and 12%, for IA-64 and TMS320C6x, respectively. Using the same model, a four-state F2V encoder can achieve slightly better compression than a four-bit V2F compression scheme.

Although the compression ratio of V2F coding using a static one-bit model is not as good as Markov V2F coding, there is an advantage to V2F coding using a static one-bit model. Since the V2F codebook constructed is static, and the probability distribution for ones and zeros is stable for a specific ISA, the compression and decompression procedures are not application specific. Therefore, the codebook and decompression engine do not require change when the application changes.

For details illustrating experimental results of compression ratios for IA-64 and TMS320C6x benchmarks using the above-referenced compression schemes, see Y. Xie, *Code Compression Algorithms and Architectures for Embedded Systems*, Ph.D. dissertation, Princeton University, 2002, which is incorporated by reference.

2.4 Code Decompression Architecture Design

Decompression core design for variable-to-fixed code compression (V2FCC) is presented. To decode the compressed code of the present invention, the codebook used for compression must be available to the decompressor.

2.4.1 Parallel Decompression for V2FCC Using Static Models

For variable-to-fixed code compression (V2FCC) using one-bit static model, parallel decompression is allowed because the codeword length is fixed and all codewords in the compressed code are independent. Again, choosing a codeword length of four achieves the best compression ratio while codebook size is small (only 16 codewords).

To decompress, the compressed code is segmented into many four-bit chunks. The four-bit chunks can be decompressed simultaneously in one clock cycle.

Figure 25:
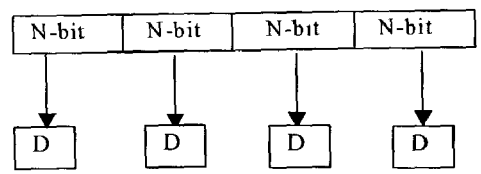
FIG. 25 illustrates parallel decompression for memoryless, Tunstall V2F coding.

FIG. 25 shows parallel decoding for memoryless variable-to-fixed coding. Each decoder D is a four-bit table lookup unit corresponding to the codebook used to compress the instructions.

Decompression is a fixed-to-variable length mapping. Each four-bit codeword may represent up to eight bits for TMS320C6x. As a result, each decoder has a four-bit input, an eight-bit output, and a three-bit output. For each four-bit input, the decoder may produce up to eight bits output. The three-bit output is used to indicate how many bits among these eight bits are valid. The same hardware design flow described in the previous section is used, and the four-bit decoder is mapped to TSMC 0.25 technology. The synthesized circuit for a single decoder D has only 47 cells, and the layout is only 5 um$^2$. After all four-bit chunks are decompressed in parallel, the outputs of each decoder are combined together to reconstruct the original fetch packet. Since all decoder outputs are available simultaneously, the outputs are shifted and combined to form a 256-bit fetch packet. Our implementation of the whole decompression unit is 0.42 mm$^2$.

2.4.2 Decompression Unit for V2FCC Using Markov Models

For Markov variable-to-fixed coding, decompression of the next N-bit chunk (assuming compression using N-bit fixed length V2F code) cannot occur before the current N-bit chunk is decompressed, because the current N-bit must be decompressed to know which codebook to use to decode the next N-bit chunk. However, decompression unit design for Markov V2FCC is simpler and smaller than the Markov F2VCC.

In Section 1, the number of entries in the decoder table is not fixed, the number of matches for different entries varies, and the number of bits to compare with the encoded instructions also varies. These uncertainties make decoder table design difficult. Some memory space must be wasted to accommodate a worse case scenario.

By using V2FCC, codebook size is fixed. If M Markov states exist, there is M codebooks, and the number of entries in the decoder table is M. For each codebook, the number of codewords is $2^N$, meaning that the number of matches for each entry is fixed. Furthermore, since N-bit V2FCC is used, N bits are always compared with the encoded instructions. For the foregoing reasons, V2FCC is more desirable than F2VCC for decompression architecture design.

To compare with the decompressor for Markov F2VCC in FIG. 18, a decompression unit design for Markov V2FCC is designed, having a four-bit Markov F2VCC for TMS320C6x using a 32×4 Markov model. The number of codebooks is 128, since there are 128 states. Each codebook has $2^4$=16 entries. Three bytes are used to store each entry, therefore, the total size of the decoder table is 128*16*3=6 KB, which is 25% smaller than the Markov F2VCC decoder table.

For each entry in the codebook, the first four bits indicate the number of decoded bits, the last seven bits are the next Markov state address (i.e., codebook address), and each four-bit codeword may be decoded into a bit sequence up to 13-bits long.

Unlike the Markov F2VCC decoder, the decoding procedure for Markov V2FCC does not include a comparison step. The encoded bits are fetched in four-bit chunks. The next Markov state address from the decoder table is left shifted four bits, and combined with the four-bit encoded bit chunk to form the next entry address.

Simulation shows that a four-way parallel multi-bit decompression architecture similar to that in FIG. 18 can achieve an average decompression speed of about 23.8 bits per clock cycle. Therefore, a fetch packet in TMS320C6x takes only about 11 cycles to decompress. This is about two times faster than the Markov F2VCC decoder described in Section 1.

5.5 Power Reduction for Instruction Bus

Power consumption on the bus is an important part of the overall system power consumption. The percentage of bus power ranges from 10% to 80% of the overall system power consumption, depending on the nature of the application, implementation, etc. On average, the I/O and busses in a typical internal circuit consume half of the total chip power. With code compression techniques, it is possible to reduce bit toggles on the instruction bus, since the compressed instructions are actually re-encoded. The key idea is to take advantage of a certain freedom to choose the codes that represent the original instructions, such that after the instructions are re-encoded, the bit-toggling is reduced. The present invention uses program trace information to reduce bus toggles on the instruction bus, by using the variable-to-fixed code compression techniques previously presented.

5.5.1 Bus Compaction

When compressing instructions block by block, the compressed block occupies less space than the original block size. For example, the compressed fetch packet for TMS320C6x would have less than 256 bits. At each instruction fetch, there will be a number of leftover, unused bits. There are two ways to pack and transfer compressed blocks via instruction bus:

- Padding bus: This approach pads the current compressed block with part of the next compressed block to increase bandwidth and reduce total memory access. This approach (compacting more than one block together) is useful only when the next compressed fetch block is the next one in terms of memory location. When program execution flow changes (e.g., a branch or jump occurs), the leftover bits are useless since they are not part of the next needed block.
- Non-padding bus: This approach leaves the leftover bits, and retransmits them, so that they are the same as the previous transaction. The total number of instruction fetches does not change, as compared to the case where there is no code compression.

These two different packing approaches may effect bus toggling. The non-padding approach results in lower bus toggles, therefore the following techniques are based on the non-padding approach.

5.5.2 Codeword Assignment in V2F Coding

Code compression generally increases bit-toggling on the bus since compression increases the "randomness" of the code. Accordingly, there is an increase in bus power consumption for each bus transaction. After instructions are compressed, however, memory access is reduced, therefore the number of bus transitions is reduced. Overall bit toggles may be reduced, compared to the original program. Through use of variable-to-fixed coding, instruction bus power consumption can be reduced when transmitting compressed instructions.

Codeword assignments for V2F coding can be arbitrary. Since the codeword length is fixed in V2F coding, any codeword assignment will result in the same compression ratio. Carefully assigning individual codewords can reduce bit toggling on the bus, therefore reducing bus power consumption since energy consumed on the bus is proportional to the number of bit toggles on the bus.

Assume that Markov V2F coding is used, where M states exist in the Markov model and the length of the codeword is N. Therefore, there are M codebooks and each codebook has $2^N$ codewords. Each codeword can be represented by $[C_i, W_j]$, in which $C_i$ ($C_i$=1,2,3 ... M) is one of the M codebooks and $W_j$ ($W_j$=1,2,3 ... $2^N$) is a label for each of the $2^N$ codewords in codebook $C_i$.

Figure 26:
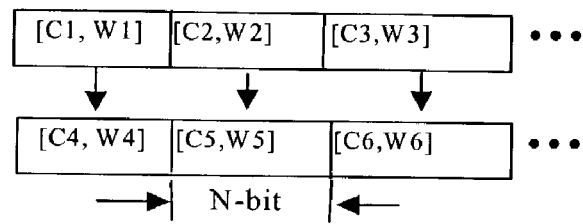
FIG. 26 illustrates codeword patterns transmitted over an instruction bus.

FIG. 26 illustrates codeword patterns transmitted over an instruction bus. $[C_iW_j]$ is an N-bit codeword belonging to codebook $C_i$. Variable-to-fixed coding provides the advantage of transferring bus transition patterns to codeword transition patterns because the codeword length is fixed.

Figure 27:
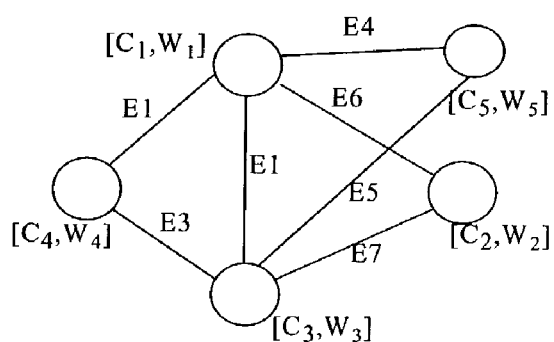
FIG. 27 illustrates a codeword transition graph.

Working through the compressed program, a codeword transition graph can be constructed, as shown in FIG. 27. Each node in the graph is a codeword in the codebook. An edge between two nodes indicates that bus transitions occur between the two codewords. Each edge has a weight $E_i$, specifying the number of transitions. The codeword transition graph relies on profiling information about adjacency of instruction pairs.

The N-bit codeword assignment can be arbitrary, except within each codebook. Each codeword within a codebook must be distinctive (i.e., for $[C_iW_j]$ and $[C_kW_l]$, if $C_i$=$C_k$, and $W_j$≠$W_l$, the N-bit binary codeword assigned to node $[C_i,W_j]$ must be different from that assigned to $[C_k,W_l]$. Hi denotes Hamming distance, representing the number of different bits existing between two, N-bit binary codewords. A Hamming distance is assigned to each pair of nodes having an edge between them. Accordingly, the number of bus toggles between two nodes is Hi*Ei. The total number of bus toggles is therefore given by summing the Hi*Ei calculation of all edges. The goal is to assign codewords so that bus toggles are minimized.

For an M-state Markov model with codeword length N, the number of possible combinations equals $(2^N!)^M$. When M=1, the problem is simplified to a classical state assignment problem in the logic synthesis domain, which proves to an NP problem. For simplicity, a greedy heuristic algorithm can be implemented to determine codeword assignment, although absolute minimization of bus toggles may not be achieved.

A greedy heuristic codeword assignment algorithm includes:

1. Sorting all edges by weight, in decreasing order;
2. For each edge, if either node is not assigned, assigning valid codewords with minimal Hamming distance; and
3. Repeating step 2 until all nodes are assigned.

The greedy algorithm sorts all the edges by weights in decreasing order. For each edge, the algorithm attempts to assign two binary N-bit codewords to the nodes associated with the edge, so that Hamming distance is minimized. The Hamming distance could be "0" if the two nodes each belong to a different codebook. The only restriction on codeword assignment; codewords in the same codebook must be distinctive.

To construct a codeword graph, program execution must be profiled to get the memory access footprint. A cycle accurate simulator could be used for TMS320C6x, and profile using a benchmark program ADPCM decoder (Adaptive Differential Pulse Code Modulation). Bus toggles are normalized over the original toggle counts 6699013. Four-bit length codewords are used with different probability models. For a static one-bit model, there is not much bus power saving available. As the model becomes larger, there is flexibility on codeword assignment, better allowing reduction to instruction bus toggles.

Code compression can be regarded as instruction re-encoding. If codes are assigned such that switching activities are reduced, the total bus energy will also be reduced. The goal is to minimize the Hamming distance between two adjacent compressed instructions. For variable length coding algorithms, minimizing the Hamming distance means lowering the entropy of the code, while compression means an increase in code entropy. Accordingly, for variable length codes, some compression must be traded off against reducing the Hamming distance. However, when using V2F coding (where codeword length is fixed), minimizing the Hamming distance of the codes has no effect on compression ratio.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A method of code compression, comprising the steps of:
   generating a static probability model for a program;
   splitting codes into blocks; and
   compressing instructions block by block to create fixed to variable code, the block by block compression providing random block access in decompression during program execution; wherein the blocks are divided into sub-blocks, the sub-blocks are compressed in parallel, and a tag is attached to a front of each block, the tag indicating a size of each compressed sub-block, whereby a decompressor is capable of determining a location of each compressed block to decompress each compressed sub-block simultaneously.

2. A method of code compression, comprising the steps of:
   generating a static probability model for a program by:
      gathering one or more sample programs for a specific instruction set architecture;
      calculating probabilities for each program; and
      determining the average of the probabilities calculated for each program to generate the static probability model;
   splitting codes into blocks; and
   compressing instructions block by block to create fixed to variable code, the block by block compression providing random block access in decompression during program execution;

wherein the static probability model assumes ones and zeros in the code have independent and identical distribution (iid), thereby allocating a fixed probability for bit 1 and bit 0 irrespective of position within instructions; and wherein each instruction fetch packet is 256-bits long and is divided into four sub-blocks, each sub-block having two instructions with eight bytes, wherein four, three bit tags are attached to the front of the block, each three bit tag indicating a number of bytes in an associated sub-block.

3. A method of code compression, comprising the steps of:

generating a static probability model for a program;

splitting codes into blocks; and compressing instructions block by block to create fixed to variable code, the block by block compression providing random block access in decompression during program execution; compressing instructions includes finite state machine encoder simplification using the static probability model, wherein encoder states and transitions never reached are removed.

4. A method of code compression, comprising the steps of:

generating a static probability model for a program, splitting codes into blocks; and compressing instructions block by block to create fixed to variable code, the block by block compression providing random block access in decompression during program execution;

wherein the static probability model assumes ones and zeros in the code have independent and identical distribution (iid), thereby allocating a fixed probability for bit 1 and bit 0 irrespective of position within instructions; and wherein a finite state machine encoder is reset to state 0 at the beginning of each block, during block by block instruction compression, thereby allowing a decoder to start decompression at a block boundary.

5. A method of code decompression, comprising the steps of:

constructing a decoder tree;

designing a multiple bit decoder table based on the decoder tree, wherein a compressed binary stream is decodable and distinguishable;

simplifying a decoder by removing states and transitions never reached through use of a static model in association with a finite state machine; and performing multiple bit decompression.

6. The method of claim 5, wherein the decoder tree is constructed by following all paths starting from state 0.

7. The method of claim 5, wherein designing the multi-bit decoder includes using a subset of the decoder tree having all ending nodes at state 0 to arrange each transition of the multi-bit decoder to come back to state 0.

8. A method of code decompression, comprising the steps of:

constructing a decoder tree by combining a Markov probability model with a finite state machine decoder table;

designing a multiple bit decoder table based on the decoder tree, wherein each entry state in the decoder table is a combination of one encoder state and one Markov state, and wherein a four-state finite state machine and a 256-state Markov probability model provide an upper bound of 1,000 entries in the decoder table; and performing multiple bit decompression.

9. A method of code decompression, comprising the steps of:

constructing a decoder tree;

designing a multiple bit decoder table based on the decoder tree; and performing multiple bit decompression by comparing encoded bits with corresponding matches in the decoder table and selecting output from the decoder table, wherein a comparator controls a multiplexor to select the output, the output including decoded bits and a next entry address, the multiplexor sending the next entry address to the decoder table.

10. A method of code decompression, comprising the steps of:

constructing a decoder tree;

designing a multiple bit decoder table based on the decoder tree; and performing multiple bit decompression by comparing encoded bits with corresponding matches in the decoder table and selecting output from the decoder table, wherein up to seven bits are matched and output simultaneously and wherein each word is a match for an entry, a first bit of each word is a valid bit, and a match is only valid when the first bit is 1.

11. The method of claim 10, wherein the first three bits after the valid bit of the word indicate how many bits to compare, bits 4 to 10 are the bits to compare, bits 11 to 13 indicate how many bits to output if a match exists, bits 14 to 20 are output bits, and a remaining eleven bits are an address of a next entry.

12. A decompression processor, comprising:

an input buffer to accept input from an instruction memory;

match logic including one or more comparators and multiplexors, the match logic receiving input from the input buffer and a decoder table; and an output buffer to accept uncompressed instruction from the input buffer or from the match logic wherein the one or more multiplexors select matches from the one or more comparators and sends uncompressed instruction to the output buffer, the one or more multiplexors instructing the input buffer how many bits have been matched and in need of shifting out, the one or more multiplexors also sending next entry addresses to the decoder table.

13. A N-way parallel decompression processor, comprising:

N-match logics, each including one or more comparators and multiplexors and each capable of comparing encoded bits to a match in a decoder table and selecting output; and one decoder table serving each of the N-match logics, the processor capable of decompressing N-sub-blocks simultaneously and in parallel, wherein N is greater than one wherein the comparator control the multiplexor to select the output, the output including decoded bit and a next entry address, the multiplexor sending the next entry address to the decoder table.

14. The processor of claim 13, wherein the decoder table is stored in N-port RAM or ROM.

15. The processor of claim 13, wherein N equals four.

16. The processor of claim 13, wherein the decoder table is designed as a finite state machine.

17. The processor of claim 13, wherein the decoder table is designed during an encoding phase and is application specific, each application having a distinctive Markov probability model.

18. The processor of claim 13, wherein the decoder table is not application specific, whereby the decoder table does not require change when an application running on a system changes.

19. A method of code compression, comprising the steps of:
generating a variable to fixed length codebook of N-bit Tunstall codewords including the steps of:
a. creating a coding tree having a root node with probability 1.0 and attaching a 0 and a 1 to the root node, wherein two leaf nodes result, one leaf node indicating a probability of 1 occurring and the other leaf node indicating a probability of 0 occurring;
b. splitting the leaf node with the highest probability into two branches, one branch labeled 0 and the other branch labeled 1, wherein the number of leaf nodes increases by 1 after splitting;
c. repeating step (b) until a total number of leaf nodes is equal to 2N; and
d. assigning equal length codewords (length=N) to the leaf nodes; and
compressing instructions block by block, thereby providing random block access in decompression during program execution.

20. The method of claim 19, wherein the assignment of equal length codewords to the leaf nodes is arbitrary.

21. A method of code compression, comprising the steps of:
generating a variable to fixed length codebook of N-bit Tunstall codewords resulting in $2^N$ codewords and including the steps of:
a. creating an initial integer interval with a range of $[0,2^N)$, making current interval the initial interval;
b. dividing the current interval into two sub-intervals, if the current interval is not a unit interval (i.e., [M,M+1)), wherein a left sub-interval is for input 0 and a right sub-interval is for input 1 and a size of the two sub-intervals is approximately proportional to a probability of the respective input but the size of each sub-interval is an integer.
c. repeating step (b) recursively for all sub-intervals until all sub-intervals become unit intervals (i.e., [0,1),[1,2), [2,3), . . . );
d. assigning equal length codewords (length=N) to the unit intervals; and
compressing instructions block by block, thereby providing random block access in decompression during program execution.

22. The method of claim 21, wherein the assignment of equal length codewords to the unit intervals is arbitrary.

23. A method of code compression, comprising the steps of:
generating a variable to fixed length codebook; and
compressing instructions block by block, thereby providing random block access in decompression during program execution, wherein compressing instructions block by block begins at a root node and includes:
a. traversing to a first branch or to a second branch depending on whether a "0" or a "1" is encountered in a respective bit sequence;
b. assigning a codeword upon encountering a leaf node, the codeword being predetermined and related to the respective leaf node; and
c. returning to the root node and repeating steps (a) and (b) for each bit sequence.

24. The method of claim 23, further comprising the step of byte aligning each compressed block.

25. The method of claim 23, further comprising the step of padding extra bits to the block if tree traversal ends at a non-leaf node, whereby traversal can continue until a leaf node is encountered.

26. A method of code compression, comprising the steps of:
generating a variable to fixed length codebook by implementing a Markov probability model including:
a. gathering statistics, wherein a width and depth of the Markov model is determined and a probability of each transition is determined; and
b. generating an N-bit variable to fixed length coding tree and codebook for each state in the Markov model, wherein N equals the number of bits in the codeword; and
compressing instructions block by block, thereby providing random block access in decompression during program execution.

27. The method of claim 26, wherein generating a codebook includes arbitrarily assigning a codeword for each bit sequence.

28. The method of claim 26, wherein each state in the Markov model has its own coding tree and codebook.

29. The method of claim 28, wherein a M-state Markov model using N-bit variable to fixed length codes includes M codebooks, wherein each codebook has 2N codewords.

30. The method of claim 28, wherein compressing instructions for each block begins using the coding tree and codebook for initial state and includes:
a. traversing the coding tree according to input bits until a leaf node is encountered;
b. producing a codeword, wherein the codeword is related to the leaf node encountered and the leaf node is associated with a Markov state;
c. proceeding to a root node of the coding tree of the state indicated by the leaf node encountered; and
d. repeating steps (a) through (c) until exhausting the input bits of the respective block.

31. A method to decompress compressed code, comprising the steps of:
segmenting fixed length compressed code into chunks, wherein a compression codeword of N-bits results in a plurality of N-bit chunks; and
decompressing the chunks simultaneously and in parallel, wherein a separate decoder is used for each chunk, the decoders each including a four bit input, an eight bit output, and a three bit output; the three bit output indicating how many bits of the eight bit output are valid.

32. The method of claim 31, wherein the chunks are decompressed simultaneously in one clock cycle.

33. The method of claim 31, wherein all decoders use an identical N-bit table lookup unit corresponding to a codebook used to compress the code.

34. The method of claim 33, wherein all decoders refer to one codebook for simultaneous decompression of all chunks.

35. The method of claim 31, wherein the compressed code involves variable to fixed coding.

36. The method of claim 31, wherein decompression is a fixed to variable length mapping.

37. The method of claim 31, further comprising the step of combining parallel and simultaneously decompressed outputs of all chunks to reconstruct an original fetch packet.

38. The method of claim 31, further comprising the step of combining and shifting the parallel and simultaneously decompressed outputs of all chunks to reconstruct an original fetch packet.

39. A method for reducing bus power consumption when transmitting compressed instructions, comprising the steps of:
- constructing a codeword transition graph from a compressed program;
- producing a formula from the codeword transition graph to determine total bus toggles required for transmission of the compressed instructions; and
- determining codeword assignments for original instructions to minimize the total bus toggles and reduce bus power consumption.

40. The method of claim 39, wherein constructing the codeword transition graph relies on profiling information about adjacency of instruction pairs.

41. The method of claim 39, wherein codeword assignments are arbitrary and each codeword in a codebook is distinctive.

42. The method of claim 39, wherein possible combinations of codeword assignments is (2N!)M for an M-state Markov model with codeword length N.

43. The method of claim 39, wherein the codeword transition graph includes:
- a. nodes, wherein each node in the graph is a codeword in a codebook;
- b. edges, wherein each edge connects two nodes and indicates that bus toggles exist between the two respective codewords; and
- c. a weight characterization associated with each edge, wherein the weight specifies a number of bus toggles existing between the two respective codewords.

44. The method of claim 43, wherein determining codeword assignments includes application of an algorithm.

45. The method of claim 44, wherein application of the algorithm includes the steps of:
- a. sorting all edges by their respective weight in decreasing order; and
- b. assigning valid codewords with minimal Hanjming distance to respective pairs of nodes associated with each edge sorted in step (a), in the order sorted in step (a).

46. The method of claim 45, wherein weight is $E_i$, Hamming distance is $H_i$, and the codeword assignments result in minimizing a sum of $H_i$, $E_i$ calculated for each edge, whereby total bus toggles are minimized.

47. The method of claim 39, wherein variable to fixed code compression techniques are used.

48. The method of claim 39, wherein the codeword transition graph profiles information about adjacency of instruction pairs to select codes for original instructions to minimize bus toggling.

\* \* \* \* \*